US008861253B2

(12) United States Patent
Chang et al.

(10) Patent No.: US 8,861,253 B2
(45) Date of Patent: Oct. 14, 2014

(54) VARIABLE RESISTANCE DEVICE, SEMICONDUCTOR DEVICE INCLUDING THE VARIABLE RESISTANCE DEVICE, AND METHOD OF OPERATING THE SEMICONDUCTOR DEVICE

(75) Inventors: Man Chang, Seongnam-si (KR); Young-bae Kim, Seoul (KR); Chang-jung Kim, Yongin-si (KR); Myoung-jae Lee, Hwaseong-si (KR); Ji-hyun Hur, Hwaseong-si (KR); Dong-soo Lee, Gunpo-si (KR); Chang-bum Lee, Seoul (KR); Seung-ryul Lee, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 103 days.

(21) Appl. No.: 13/313,720

(22) Filed: Dec. 7, 2011

(65) Prior Publication Data
US 2012/0161821 A1  Jun. 28, 2012

(30) Foreign Application Priority Data

Dec. 24, 2010  (KR) .................. 10-2010-0134907
Oct. 27, 2011  (KR) .................. 10-2011-0110720

(51) Int. Cl.
*G11C 11/00* (2006.01)
*G11C 11/56* (2006.01)
*G11C 13/00* (2006.01)

(52) U.S. Cl.
CPC .... *G11C 13/0069* (2013.01); *G11C 2013/0073* (2013.01); *G11C 11/5685* (2013.01); *G11C 13/0064* (2013.01)
USPC ...................................... 365/148; 365/189.07

(58) Field of Classification Search
USPC ............................................ 365/148, 189.07
See application file for complete search history.

(56) References Cited

U.S. PATENT DOCUMENTS 7,978,499 B2 *  7/2011  Hosono et al. ................ 365/148
8,023,313 B2 *  9/2011  Toda ............................. 365/148
(Continued)

FOREIGN PATENT DOCUMENTS

JP  2005-159359 A  6/2005
JP  2009-099199 A  5/2009
(Continued)

OTHER PUBLICATIONS

European Search Report dated Apr. 3, 2012, issued for Application No. 11193851.0-1233.

(Continued)

*Primary Examiner* — Viet Q Nguyen
(74) *Attorney, Agent, or Firm* — Harness, Dickey & Pierce, P.L.C.

(57) ABSTRACT

A method of operating a semiconductor device that includes a variable resistance device, the method including applying a first voltage to the variable resistance device so as to change a resistance value of the variable resistance device from a first resistance value to a second resistance value that is different from the first resistance value; sensing first current flowing through the variable resistance device to which the first voltage is applied; determining whether the first current falls within a predetermined range of current; and if the first current does not fall within the first range of current, applying an additional first voltage that is equal to the first voltage to the variable resistance device.

28 Claims, 17 Drawing Sheets

(56) References Cited

U.S. PATENT DOCUMENTS

| | | | |
|---|---|---|---|
| 8,274,815 B2* | 9/2012 | Ichihara et al. | 365/148 |
| 8,324,608 B2* | 12/2012 | Nakagawa et al. | 257/4 |
| 8,378,331 B2* | 2/2013 | Satoh et al. | 257/2 |
| 8,395,925 B2* | 3/2013 | Kawai et al. | 365/148 |
| 8,395,930 B2* | 3/2013 | Muraoka et al. | 365/148 |
| 8,488,367 B2* | 7/2013 | Shimotori et al. | 365/148 |
| 8,498,141 B2* | 7/2013 | Sasaki et al. | 365/148 |
| 8,537,591 B2* | 9/2013 | Kim et al. | 365/148 |
| 2009/0212273 A1 | 8/2009 | Zhao et al. | |
| 2010/0110763 A1 | 5/2010 | Li et al. | |
| 2012/0236624 A1* | 9/2012 | Costa et al. | 365/148 |
| 2013/0058153 A1* | 3/2013 | Chang et al. | 365/148 |

FOREIGN PATENT DOCUMENTS

| | | |
|---|---|---|
| KR | 2007-0064134 A | 6/2007 |
| KR | 2009-0095313 A | 9/2009 |
| KR | 2010-0035445 A | 4/2010 |
| WO | WO 2009/142828 | 11/2009 |

OTHER PUBLICATIONS

Sakotsubo, Y. et al., "A New Approach for Improving Operating Margin of Unipolar ReRAM using Local Minimum of Reset Voltage," 2010 IEEE Symposium on VLSI Technology Digest of Technical Papers, Jun. 15, 2010, pp. 87-88, XP031738369. ISBN: 978-1-4244-5451-8.

Terai, M. et al., "Resistance Controllability of $Ta_2O_5/TiO_2$ Stack ReRAM for Low-Voltage and Multilevel Operation," 2010 IEEE Electron Device Letters, IEEE Service Center, New York, US, vol. 31, No. 3, Mar. 1, 2010 pp. 204-206, XP011300774, ISSN: 0741-3106.

* cited by examiner

VARIABLE RESISTANCE DEVICE, SEMICONDUCTOR DEVICE INCLUDING THE VARIABLE RESISTANCE DEVICE, AND METHOD OF OPERATING THE SEMICONDUCTOR DEVICE

CROSS-REFERENCE TO RELATED APPLICATIONS

This application claims the benefit of Korean Patent Application No. 10-2010-0134907, filed on Dec. 24, 2010, and Korean Patent Application No. 10-2011-0110720, filed on Oct. 27, 2011 in the Korean Intellectual Property Office, the disclosure of both of which is incorporated herein in their entirety by reference.

BACKGROUND

1. Field

The present disclosure relates to semiconductor devices, and more particularly, to a variable resistance device, a semiconductor device that includes the variable resistance device, and a method operating the semiconductor device.

2. Description of the Related Art Description of the Related Art

As a need for memory devices that have high storage capacity and consume less power has been increased, research has been conducted into next-generation memory devices that are not only non-volatile but also do not need to be refreshed. Such a next-generation memory device is required to have high integration characteristics of Dynamic Random Access Memory (DRAM), non-volatile characteristics of flash memory, high-speed operating characteristics of Static RAM (SRAM), and so on. Recently, much attention has been paid to next-generation memory devices, such as Phase change RAM (PRAM), Nano Floating Gate Memory (NFGM), Polymer RAM (PoRAM), Magnetic RAM (MRAM), Ferroelectric RAM (FeRAM), and Resistive RAM (RRAM). From among the above next-generation memory devices, RRAM is based on the phenomenon that a path in which current flows is generated thus lowering electrical resistance when a sufficient high current Is applied to a nonconductive material. In this case, once the path is generated, the path may be canceled or regenerated by applying an adequate voltage to the nonconductive material.

SUMMARY

Provided are a variable resistance device, the dispersion of current of which is improved so as to increase the reliability of a semiconductor device including the variable resistance device, the semiconductor device, and a method of operating the semiconductor device.

Additional aspects will be set forth in part in the description which follows and, in part, will be apparent from the description, or may be learned by practice of the presented embodiments.

According to an aspect of the present invention, a method of operating a semiconductor device having a variable resistance device, includes applying a first voltage to the variable resistance device so as to change a resistance value of the variable resistance device from a first resistance value to a second resistance value that is different from the first resistance value; sensing first current flowing through the variable resistance device to which the first voltage is applied; determining whether the first current falls within a predetermined range of current; and if the first current does not fall within the first range of current, applying an additional first voltage that is equal to the first voltage to the variable resistance device.

The first resistance value may be a set resistance value, the second resistance value may be a reset resistance value, and the second resistance value may be greater than the first resistance value.

The sensing of the first current may include sensing the first current flowing through the variable resistance device by applying a read voltage, the magnitude of which is lower than the first voltage.

During the applying of the first voltage, the first voltage may be applied for about 1 µs to about 1 ns.

The additional first voltage may have the same pulse width as the first voltage.

The first range of current may be preset in such a manner that a predetermine sensing margin is secured between 'on' current flowing through the variable resistance device when the variable resistance device has the first resistance value and 'off' current flowing through the variable resistance device when the variable resistance device has the second resistance value.

The first range of current may be preset in such a manner that a predetermine sensing margin is secured between first 'off' current flowing through the variable resistance device when the variable resistance device has the second resistance value and second 'off' current flowing through the variable resistance device when the variable resistance device has a third resistance value that is greater than the second resistance value.

The method may further include repeatedly performing the sensing of the first current and the determining of whether the first current falls within the predetermined first range of current with respect to the variable resistance device to which the additional first voltage is applied.

Until the first current falls within the predetermined first range of current, the applying of the additional first voltage to the variable resistance device, the sensing of the first current, and the determining of whether the first current falls within the predetermined first range of current may be repeatedly performed.

Before the determining of whether the first current falls within the predetermined first range of current, the method may further include determining whether the first current falls within a second range of current that is a range of current of data corresponding to the second resistance value.

The first range of current is included in the second range of current.

If the first current is greater than a maximum value in the second rang of current, the method may further include changing the first voltage.

The applying of the changed first voltage and the sensing of the first current may be repeatedly performed on the variable resistance device.

If the first current is less than a minimum value in the second range of current, the method may further include applying a second voltage to the variable resistance device so that the resistance value of the variable resistance device is changed from the second resistance value to the first resistance value.

The applying of the first voltage and the sensing of the first current may be repeatedly performed on the variable resistance device to which the second voltage is applied.

The determining of whether the first current falls within the predetermined first range of current may include at least one of determining whether the first current is less than a maximum value in the predetermined first range of current, and determining whether the first current is greater than a minimum value in the predetermined first range of current.

The determining of whether the first current falls within the predetermined first range of current may include the difference between 'on' current flowing through the variable resistance device when the variable resistance device has the first resistance value and the first current is greater than a predetermined level.

The method may further include applying a second voltage to the variable resistance device so that the resistance value of the variable resistance device is changed from the second resistance value to the first resistance value; and sensing second current flowing through the variable resistance device to which the second voltage is applied.

The sensing of the second current may include sensing the second current flowing through the variable resistance device to which the second voltage is applied, by applying a read voltage, the magnitude of which is lower than the first voltage and the second voltage.

The second voltage is applied for about 1 µs to about 1 ns.

The applying of the first voltage to the variable resistance device may be performed after performing the sensing of the second voltage.

The method may further include determining whether the second current falls within a third range of current; and if the second current does not fall within the third range of current, applying an additional second voltage that is equal to the second voltage to the variable resistance device.

If the second current falls within the third range of current, the method may further include applying the first voltage to the variable resistance device.

The sensing of the second voltage and the determining of whether the second current falls within the third range of current may be repeatedly performed with respect to the variable resistance device to which the additional second voltage is applied.

According to another aspect of the present invention, a variable resistance device includes a first electrode and a second electrode; and a variable resistance material layer disposed between the first and second electrodes, a resistance value of the variable resistance material layer being changed from a first resistance value to a second resistance value greater than the first resistance value when a first voltage is applied between the first and second electrodes, and being changed from the second resistance value to the first resistance value when a second voltage is applied between the first and second electrodes. If the variable resistance material layer has the second resistance value, the first voltage is repeatedly applied to the variable resistance material layer until current flowing through the variable resistance device falls within a first range of current.

The resistance value of the variable resistance material layer may be changed from the second resistance value to a third resistance value that is greater than the second resistance value, when a third voltage that is greater than the first voltage is applied to the variable resistance material layer. If the variable resistance material layer has the third resistance value, the third voltage may be repeatedly applied to the variable resistance device until current flowing through the variable resistance material layer falls with a second range of current.

According to another aspect of the present invention, a semiconductor device includes a variable resistance device, the resistance value of which is changed from a first resistance value to a second resistance value that is greater than the first resistance value when a first voltage is applied to the variable resistance device, and is changed from the second resistance value to the first resistance value when a second voltage is applied to the variable resistance device; and a selection device connected in series to the variable resistance device. If the variable resistance device has the second resistance value, the first voltage is repeatedly applied to the variable resistance device until current flowing through the variable resistance device falls within a first range of current.

The resistance value of the variable resistance device may be changed from the second resistance value to a third resistance value that is greater than the second resistance value when a third voltage that is higher than the first voltage is applied to the variable resistance device. If the variable resistance device has the third resistance value, the third voltage may be repeatedly applied to the variable resistance device until current flowing through the variable resistance device falls within a second range of current.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
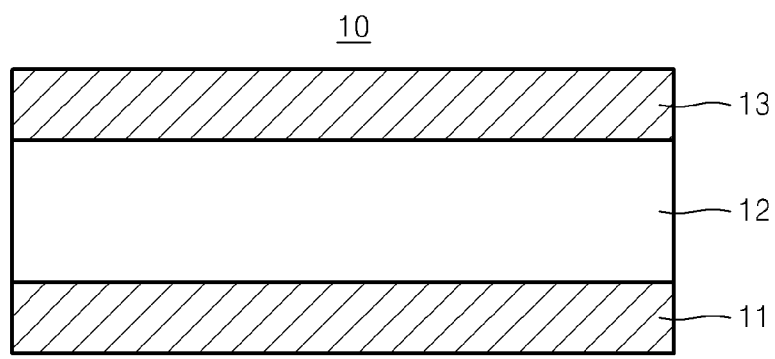
FIG. 1 is a schematical cross-sectional view of a variable resistance device according to an embodiment of the present invention.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. Accordingly, the embodiments are merely described below, by referring to the figures, to explain aspects of the present description.

In the drawings, the size of each constitutional element may be exaggerated for clarity.

The terms used in the following embodiments of the present invention may be understood as being known generally in the technical field to the invention pertains. As used herein, 'at least one' means one or more and thus may include individual components as well as mixtures/combinations.

FIG. 1 is a schematical cross-sectional view of a variable resistance device 10 according to an embodiment of the present invention. Referring to FIG. 1, the variable resistance device 10 may include a lower electrode 11, a variable resistance material layer 12, and an upper electrode 13. The variable resistance material layer 12 may be formed between the lower electrode 11 and the upper electrode 13. In another embodiment of the present invention, the variable resistance device 10 may further include a buffer layer (not shown) on the lower electrode 11 or on the variable resistance material layer 12.

The lower electrode 11 and the upper electrode 13 may be formed of a conductive material, for example, an oxidation resistant metal layer or a polysilicon layer. For example, the oxidation resistant metal layer may be formed of at least one selected from the group consisting of iridium (Ir), platinum (Pt), an iridium oxide (IrO), a titanium nitride (TiN), a titanium aluminum nitride (TiAlN), tungsten (W), molybdenum (Mo), ruthenium (Ru), and a ruthenium oxide (RuO). The oxidation resistant metal layer may be formed after the buffer layer is formed. In the current embodiment, the lower electrode 11 and the upper electrode 13 are located on and below the variable resistance material layer 12, respectively, but the present invention is not limited thereto. In another embodiment of the present invention, the lower electrode 11 and the upper electrode 13 may be located to the left and right sides of the variable resistance material layer 12, respectively.

The variable resistance material layer 12 may include a perovskite-based oxide or a transition metal oxide. Examples of the perovskite-based oxide include $Pr_{1-x}Ca_xMnO_3$, $La_{1-x}Ca_xMnO_3$, $SrZrO_3/SrTiO_3$, $CrTiO_3$, $Pb(Zr, Ti)O_3/Zn_{1-x}Cd_xS$, and so on. Examples of the transition metal oxide include nickel, niobium, titanium, zirconium, hafnium, cobalt, iron, copper, manganese, zinc, chrome, and so on. A resistance value of the variable resistance material layer 12 may vary according to the difference between voltages applied to the lower electrode 11 and the upper electrode 13.

Figure 2:
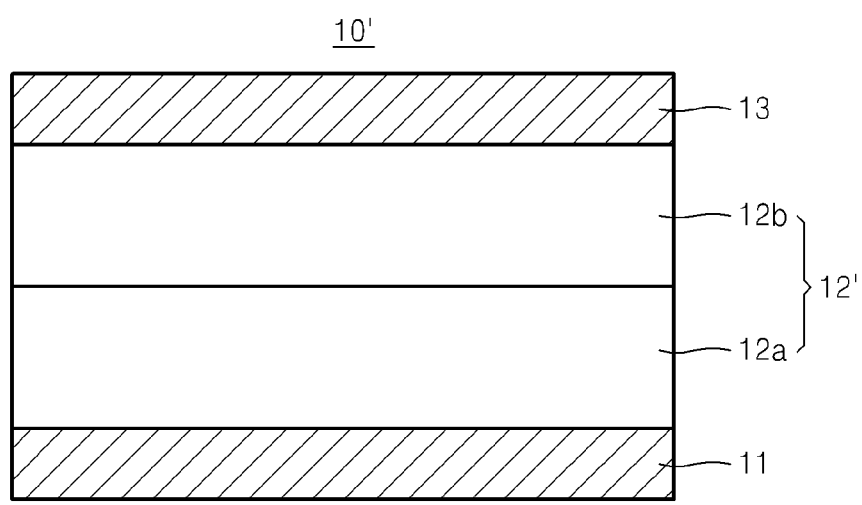
FIG. 2 is a schematical cross-sectional view of a variable resistance device according to another embodiment of the present invention.

FIG. 2 is a schematical cross-sectional view of a variable resistance device 10' according to another embodiment of the present invention. Referring to FIG. 2, the variable resistance device 10' may include a lower electrode 11, a variable resistance material layer 12', and an upper electrode 13. The variable resistance material layer 12' may be formed between the lower electrode 11 and the upper electrode 13. In the current embodiment, the variable resistance material layer 12' may include a base thin film 12a and an oxygen exchange layer 12b. For example, the base thin film 12a may include a $TaO_x$ layer, and the oxygen exchange layer 12b may include a $Ta_2O_5$ layer. The variable resistance device 10' according to the current embodiment is a modified example of the variable resistance device 10 illustrated in FIG. 1, and the embodiment described above with reference to FIG. 1 may also be applied to the current embodiment.

Figure 3:
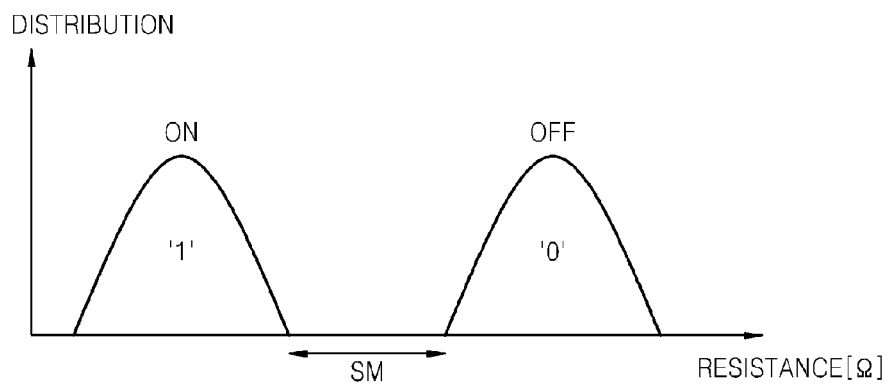
FIG. 3 is a graph illustrating a distribution of resistance values of a variable resistance device when the variable resistance device is included in a single-bit memory device, according to an embodiment of the present invention.

FIG. 3 is a graph illustrating a distribution of resistance values of a variable resistance device when the variable resistance device is included in a single-bit memory device, according to an embodiment of the present invention. In FIG. 3, the X-axis denotes a resistance value of the single-bit memory device that includes the variable resistance device, and the Y-axis denotes the total number of single-bit memory cells. The variable resistance device 10 of FIG. 1 or the variable resistance device 10' of FIG. 2 may be used in a semiconductor device, such as a single-bit non-volatile memory device, which memorizes data '0' or '1' according to the resistance state of the variable resistance material layer 12 or 12'.

In the current embodiment, data '0' and data '1' may denote a high resistance state and a low resistance state. Writing data '1' to the variable resistance device may be referred to as a set operation, and writing data '0' to the variable resistance device may be referred to as a reset operation. However, the present invention is not limited thereto, and according to another embodiment of the present invention, data '1' and data '0' may correspond to a high resistance state and a low resistance state.

A single-bit non-volatile memory device may be 'on' when data '1' is written thereto, and may be 'off' when data '0' is written thereto. In this case, in order to improve the reliability of the single-bit non-volatile memory device, a sufficient sensing margin SM between the 'on' state and the 'off' state of the single-bit non-volatile memory device should be secured.

Figure 4:
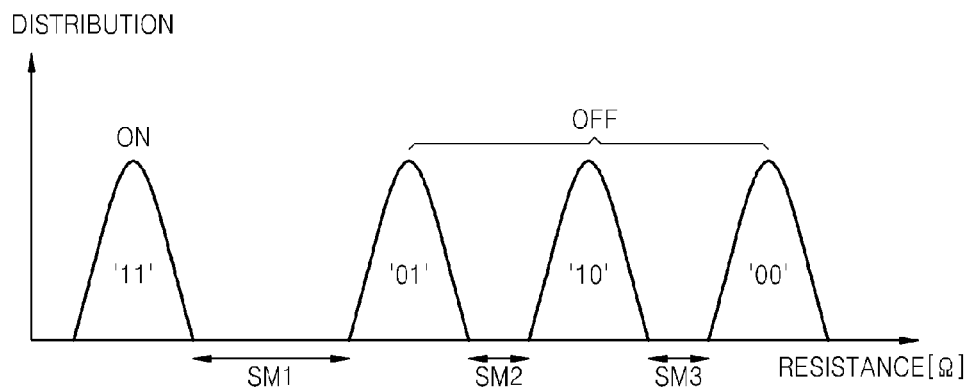
FIG. 4 is a graph illustrating a distribution of resistance values of a variable resistance device when the variable resistance device is included in a multi-bit memory device, according to another embodiment of the present invention.

FIG. 4 is a graph illustrating a distribution of resistance values of a variable resistance device when the variable resistance device is included in a multi-bit memory device, according to another embodiment of the present invention. In FIG. 4, the X-axis denotes a resistance value of the multi-bit memory device that includes the variable resistance device, and the Y-axis denotes the total number of multi-bit memory cells. The variable resistance device 10 of FIG. 1 or the variable resistance device 10' of FIG. 2 may be used in a semiconductor device, such as a multi-bit non-volatile memory device, which memorizes data '00', '01', '10', or '11' according to the resistance state of the variable resistance material layer 12 or 12'.

In the current embodiment, data '11' may denote a low resistance state of the variable resistance material layer 12 or 12', and data '01', '10', and '00' may denote a high resistance state of the variable resistance material layer 12 or 12'. Writing data '11' to the variable resistance device may be referred to as a set operation, and writing data '01', '10', and '00' to the variable resistance device may be referred to as a reset operation. However, the present invention is not limited thereto, and according to another embodiment of the present invention, data '11' may correspond to the high resistance state and data '01', '10', and '00' may correspond to the low resistance state.

A multi-bit non-volatile memory device may be 'on' when data '11' is written thereto, and may be 'off' when data '01', '10', or '00' is written thereto. In this case, in order to improve the reliability of the multi-bit non-volatile memory device, a sufficient sensing margin SM1 between the 'on' state and the 'off' state of the single-bit non-volatile memory device should be secured. Furthermore, three types of data may correspond to the 'off' state of the multi-bit non-volatile memory device, and therefore, sufficient sensing margins SM2 and SM2 among the three types of data corresponding to the 'off' state should be secured.

The variable resistance device 10 of FIG. 1 or the variable resistance device 10' of FIG. 2 may be used in a semiconductor device, such as a 3-bit non-volatile memory device, which memorizes data '000', '001', '010', '011', '100', '101', '110', or '111' according to the resistance state of the variable resistance material layer 12 or (12'). Further, the variable resistance device 10 of FIG. 1 or the variable resistance device 10' of FIG. 2 may be used as a semiconductor device, such as a four or more bit non-volatile memory device, according to the resistance state of the variable resistance material layer 12 or 12'.

Figure 5:
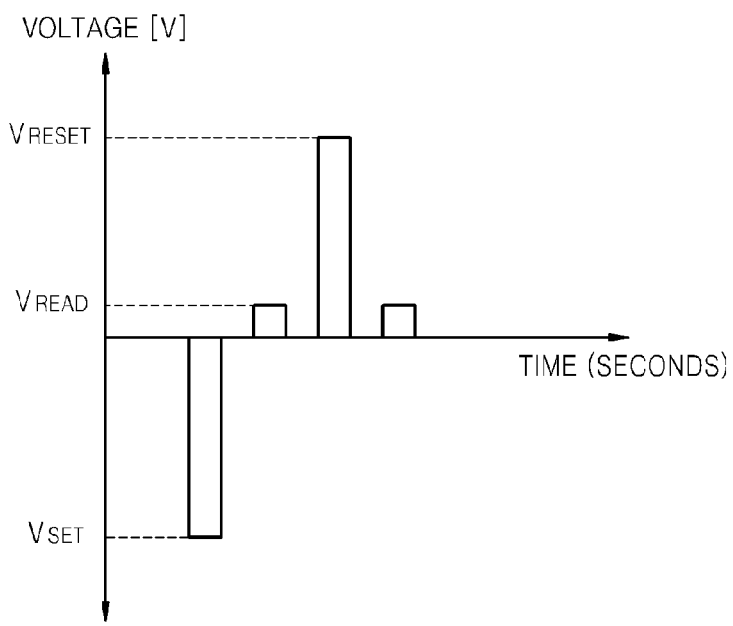
FIG. 5 is a graph showing an example of operating voltages applied to the variable resistance device 10 of FIG. 1.

FIG. 5 is a graph showing an example of operating voltages applied to the variable resistance device 10 of FIG. 1. In FIG. 5, the X-axis denotes time (seconds) and the Y-axis denotes a voltage (V) applied to the variable resistance device 10. The voltage (V) applied to the variable resistance device 10 denote the difference between voltages applied to the lower and upper electrodes 11 and 13 of the variable resistance device 10, and more particularly, a value obtained by subtracting the voltage applied to the upper electrode 13 from the voltage applied to the lower electrode 11.

First, a set voltage $V_{SET}$ may be applied to the variable resistance device 10, and a read voltage $V_{READ}$ may be applied thereto to sense current flowing through the variable resistance device 10. A cycle in which the set voltage $V_{SET}$ and the read voltage $V_{READ}$ are continuously applied to the variable resistance device 10, may be referred to as a set cycle. The variable resistance device 10 may be switched from the high resistance state to the low resistance state when the set voltage $V_{SET}$ is applied thereto. In this case, current may flow through the variable resistance device 10.

Next, a reset voltage $V_{RESET}$ may be applied to the variable resistance device 10, and the read voltage $V_{READ}$ may be applied thereto to sense current flowing through the variable resistance device 10. A cycle in which the reset voltage $V_{RESET}$ and the read voltage $V_{READ}$ are continuously applied to the variable resistance device 10, may be referred to as a reset cycle. The variable resistance device 10 may be switched from the low resistance state to the high resistance state when the reset voltage $V_{RESET}$ is applied thereto. In this case, few current may flow through the variable resistance device 10.

Here, the polarities of the reset voltage $V_{RESET}$ and the set voltage $V_{SET}$ may be opposite to each other. If the variable resistance device 10 has the reset voltage $V_{RESET}$ and the set voltage $V_{SET}$, the polarities of which are opposite to each other, then the variable resistance device 10 is referred to as a 'bipolar variable resistance device'. In the graph of FIG. 5, the set voltage $V_{SET}$ and the reset voltage $V_{RESET}$ applied to the variable resistance device 10 have a negative value and a positive value, respectively. However, the present invention is not limited thereto, and the set voltage $V_{SET}$ may have the positive value and the reset voltage $V_{RESET}$ may have the negative value according to the type of material used to form the variable resistance material layer 12 of the variable resistance device 10.

Each of the set voltage $V_{SET}$ and the reset voltage $V_{RESET}$ may be applied to the variable resistance device 10 for about 1 μs to about 1 ns, and may have one of various pulse shapes, e.g., a rectangular shape, a saw-tooth shape, or a trapezoid shape.

Although not shown, if the variable resistance device 10 is used in a multi-bit non-volatile memory device, then first to third reset voltages that are different from one another may be applied to the variable resistance device 10 so as to write different types of data corresponding to the 'off' state of the multi-bit non-volatile memory device to the multi-bit non-volatile memory device, respectively. For example, the third reset voltage for writing data '00' to the variable resistance device 10 may be higher than the second reset voltage for writing data '10' to the variable resistance device 10, and the second reset voltage may be higher than the first reset voltage for writing data '01' to the variable resistance device 10.

Figure 6:
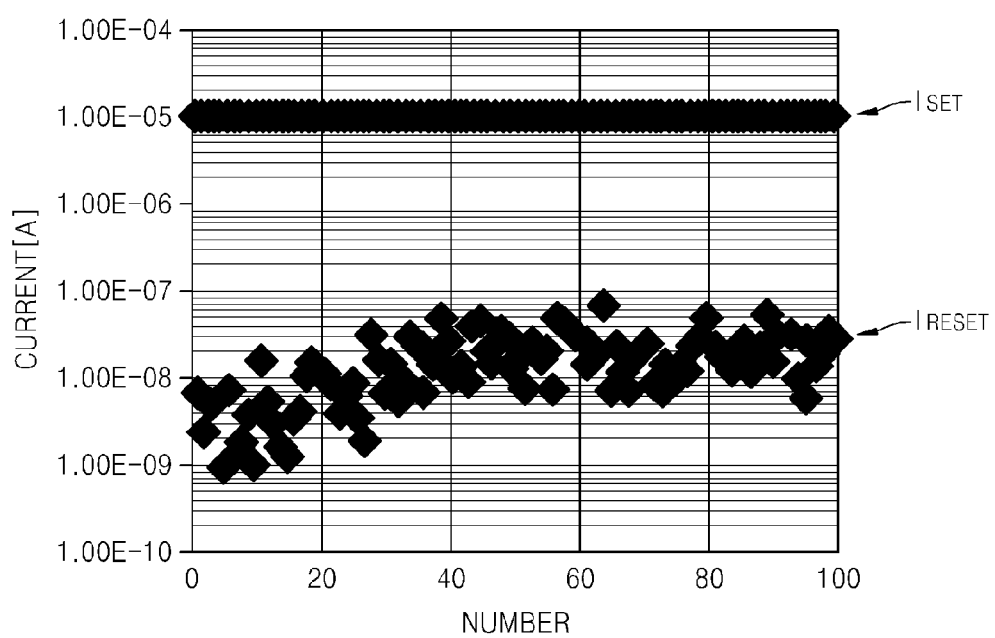
FIG. 6 is a graph showing a variation in the amount of current flowing through the variable resistance device of FIG. 1 when the operating voltages of FIG. 5 are applied to thereto.

FIG. 6 is a graph showing a variation in the amount of current flowing through the variable resistance device 10 of FIG. 1 when the operating voltages of FIG. 5 are applied thereto. In FIG. 6, the X-axis denotes a number of times that the set cycle or the reset cycle is performed, and the Y-axis denotes the amount of current (A). Current flowing through the variable resistance device 10 after the set cycle, i.e., current sensed when the set voltage $V_{SET}$ and the read voltage $V_{SET}$ are sequentially applied to the variable resistance device 10, is referred to as set current $I_{SET}$. Also, current flowing through the variable resistance device 10 after the reset cycle, i.e., current sensed when the reset voltage $V_{RESET}$ and the read voltage $V_{READ}$ are sequentially applied to the variable resistance device 10, is referred to as reset current $I_{RESET}$.

In FIG. 6, the set current $I_{SET}$ is maintained at a constant current level of about 1.00E-5 A. That is, the set current $I_{SET}$ is maintained at a constant current level regardless of a number of times that the set cycle is performed. However, the reset current $I_{RESET}$ has a relatively large dispersion and is maintained at a current level of about 1.00E-9 to about 1.00E-7. In this case, the reset current $I_{RESET}$ shows a non-linear distribution regardless of a number of times that the reset cycle is performed.

As described above, in the variable resistance device 10, the set current $I_{SET}$ has a relatively small dispersion and the reset current $I_{RESET}$ has a relatively large dispersion. Thus, when a sensing margin between the 'on' state and the 'off' state of the variable resistance device 10 is not sufficiently secured, the variable resistance device 10 is difficult to be used as a memory device. In particular, when the variable resistance device 10 is used in a multi-bit non-volatile memory device, a plurality of pieces of data corresponding to the 'off' state of the variable resistance device 10 should be differentiated from one another. In this case, when a sensing margin between the plurality of pieces of data is not sufficiently secured, the reliability of the multi-bit non-volatile memory device 10 is greatly lowered.

Figure 7:
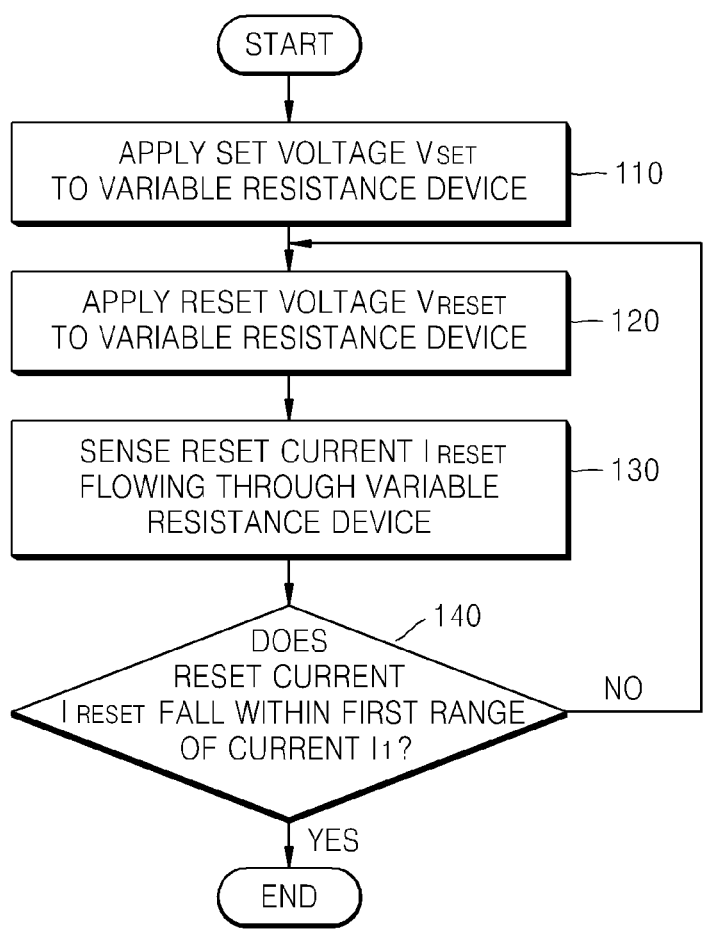
FIG. 7 is a flowchart illustrating a method of operating a semiconductor device that includes a variable resistance device, according to an embodiment of the present invention.
Figure 8:
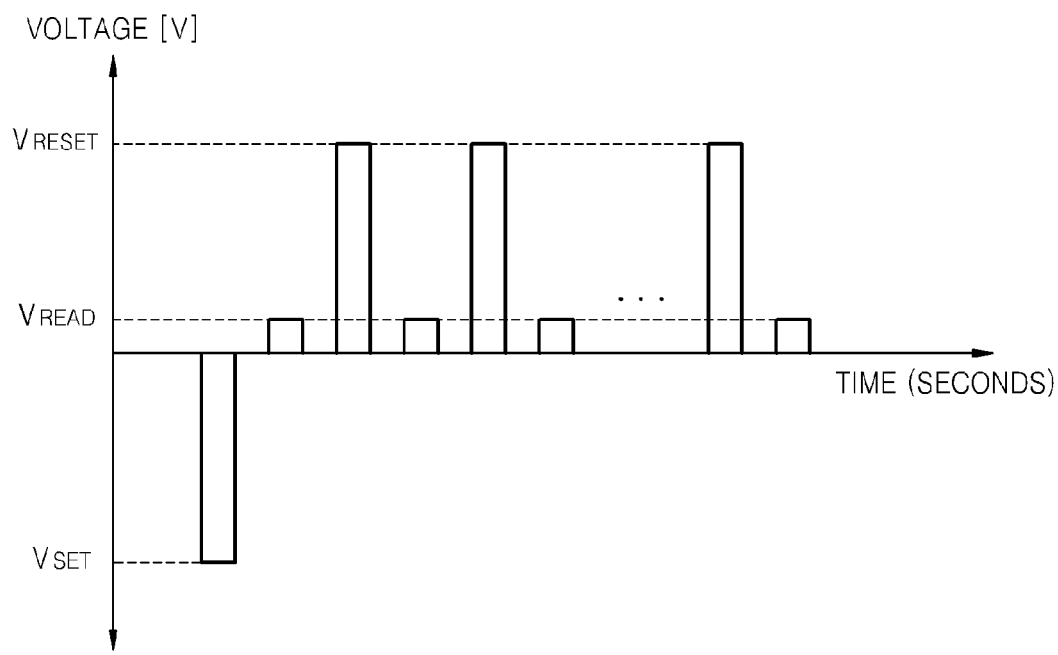
FIG. 8 is a graph showing an example of operating voltages applied to a semiconductor device according to the method of FIG. 7.

FIG. 7 is a flowchart illustrating a method of operating a semiconductor device that includes a variable resistance device, according to an embodiment of the present invention. FIG. 8 is a graph showing an example of operating voltages applied to a semiconductor device according to the method of FIG. 7.

Referring to FIGS. 7 and 8, in the method according to the current embodiment, a semiconductor device that includes the variable resistance device 10 of FIG. 1 may be operated. The method according to the current embodiment will now be described, for example, in relation to the variable resistance device 10 of FIG. 1. In the current embodiment, it is assumed that the variable resistance device 10 is used in a multi-bit non-volatile memory device. In FIG. 8, the X-axis denotes time (seconds) and the Y-axis denotes operating voltages (V) applied to the semiconductor device.

In operation 110, a set voltage $V_{SET}$ is applied to the variable resistance device 10. The set voltage $V_{SET}$ may correspond to the set voltage $V_{SET}$ illustrated in FIG. 8. The set voltage $V_{SET}$ illustrated in FIG. 8 may be a negative voltage, e.g., about −3.0 V.

In operation 120, a reset voltage $V_{RESET}$ is applied to the variable resistance device 10. The reset voltage $V_{RESET}$ may correspond to the reset voltage $V_{RESET}$ illustrated in FIG. 8. The reset voltage $V_{RESET}$ illustrated in FIG. 8 may be a positive voltage and may be higher than the read voltage $V_{READ}$.

When the variable resistance device 10 is used in a multi-bit non-volatile memory device, first to third reset voltages may be applied to write different data '01', '10', and '00' corresponding to the 'off' state, respectively. For example, the first reset voltage for writing data '01' to the multi-bit non-volatile memory device may be about 3.2 V, the second reset voltage for writing data '10' to the multi-bit non-volatile memory device may be about 3.3 V, and the third reset voltage for writing data '00' to the multi-bit non-volatile memory device may be about 3.4 V.

In operation 130, reset current $I_{RESET}$ flowing through the variable resistance device 10 to which the reset voltage $V_{RESET}$ is applied, is sensed. Specifically, the read voltage $V_{READ}$ may be applied to the variable resistance device 10 to which the reset voltage $V_{RESET}$ is applied, and then the reset current $I_{RESET}$ flowing through the variable resistance device 10 may be sensed. The read voltage $V_{READ}$ may correspond to the read voltage $V_{READ}$ of FIG. 8. The read voltage $V_{READ}$ illustrated in FIG. 8 may be a positive voltage, e.g., about 0.5 V.

In operation 140, it is determined whether the sensed reset current $I_{RESET}$ falls within a first range of current $I_1$. The first range of current $I_1$ may be preset to improve the dispersion of the reset current $I_{RESET}$ flowing through the variable resistance device 10, i.e., 'off' current. In detail, the first range of current $I_1$ may be preset to secure a sufficient sensing margin between the 'on' current and the 'off' current of the variable resistance device 10. Operation 140 will be described in detail with reference to FIGS. 9 to 12 later.

The method ends when it is determined in operation 140 that the sensed reset current $I_{RESET}$ falls within the first range of current $I_1$. Operation 120 is performed when the sensed reset current $I_{RESET}$ does not fall within the first range of current $I_1$. If the sensed reset current $I_{RESET}$ does not fall within the first range of current $I_1$, operation 120 may be performed to additionally apply the reset voltage $V_{RESET}$ to the variable resistance device 10. The additionally applied reset voltage $V_{RESET}$ may correspond to the reset voltage $V_{RESET}$ illustrated in FIG. 8. Thus, the additionally applied reset voltage $V_{RESET}$ may be equal to and have the same pulse width as the reset voltage $V_{RESET}$.

Figure 9:
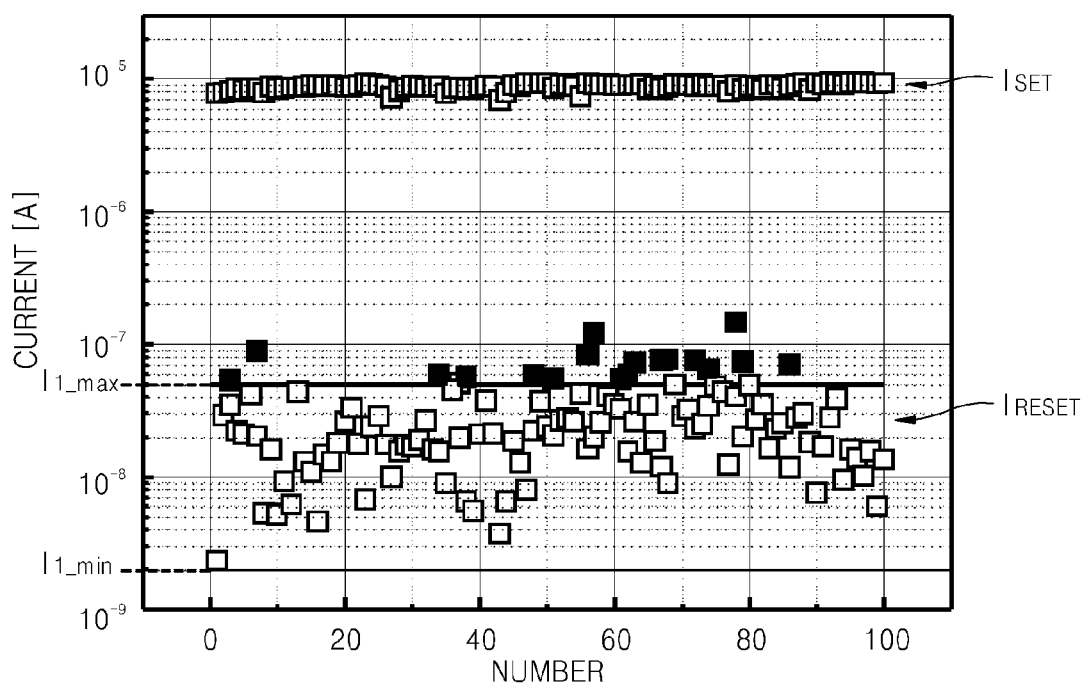
FIG. 9 is a graph showing current flowing through a variable resistance device so as to explain operation 140 included in the method of FIG. 7, according to an embodiment of the present invention.

FIG. 9 is a graph showing current flowing through the variable resistance device 10 of FIG. 1 so as to explain operation 140 included in the method of FIG. 7, according to an embodiment of the present invention. In FIG. 9, the X-axis denotes a number of times that the set cycle or the reset cycle is performed, and the Y-axis denotes the amount of current (A). Current flowing through the variable resistance device 10 after the set cycle, i.e., current sensed when the set voltage $V_{SET}$ and the read voltage $V_{SET}$ are sequentially applied to the variable resistance device 10, is referred to as set current $I_{SET}$. Also, current flowing through the variable resistance device 10 after the reset cycle, i.e., current sensed when the reset voltage $V_{RESET}$ and the read voltage $V_{READ}$ are sequentially applied to the variable resistance device 10, is referred to as reset current $I_{RESET}$. For example, the set voltage $V_{SET}$ may be about −5 V and may be applied for about 1 μs, and the reset voltage $V_{RESET}$ may be about 7 V and may be applied for about 1 μs.

In the current embodiment, when it is determined whether the sensed reset current $I_{RESET}$ falls within the first range of current $I_1$, in operation 140, it may be determined whether the sensed reset current $I_{RESET}$ is less than or equal to a maximum value $I_{1\_max}$ in the first range of current $I_1$. For example, the maximum value $I_{1\_max}$ in the first range of current $I_1$ may be about 5E-8 A.

If the sensed reset current $I_{RESET}$ is less than or equal to than the maximum value $I_{1\_max}$, it is determined that the sensed reset current $I_{RESET}$ falls within the first range of current $I_1$. In FIG. 9, a case where the sensed reset current $I_{RESET}$ falls within the first range of current $I_1$ is indicated using '□'. If the sensed reset current $I_{RESET}$ is greater than the maximum value $I_{1\_max}$, then it may be determined that the sensed reset current $I_{RESET}$ does not fall within the first range of current $I_1$. In FIG. 9, a case where the sensed reset current $I_{RESET}$ does not fall within the first range of current $I_1$ is indicated using '■'.

According to the current embodiment, when it is determined whether the sensed reset current $I_{RESET}$ falls within the first range of current $I_1$, in operation 140, it may be determined whether the sensed reset current $I_{RESET}$ is equal to or greater than a minimum value $I_{1\_min}$ in the first range of current $I_1$. For example, the minimum value $I_{1\_min}$ in the first range of current $I_1$ may be about 8E-9 A.

If the sensed reset current $I_{RESET}$ is equal to or greater than the minimum value $I_{1\_min}$, it is determined that the sensed reset current $I_{RESET}$ falls within the first range of current $I_1$. In FIG. 9, a case where the sensed reset current $I_{RESET}$ falls within the first range of current $I_1$ is indicated using '□'. If the sensed reset current $I_{RESET}$ is less than the minimum value $I_{1\_min}$, it may be determined that the sensed reset current $I_{RESET}$ does not fall within the first range of current $I_1$.

Figure 10:
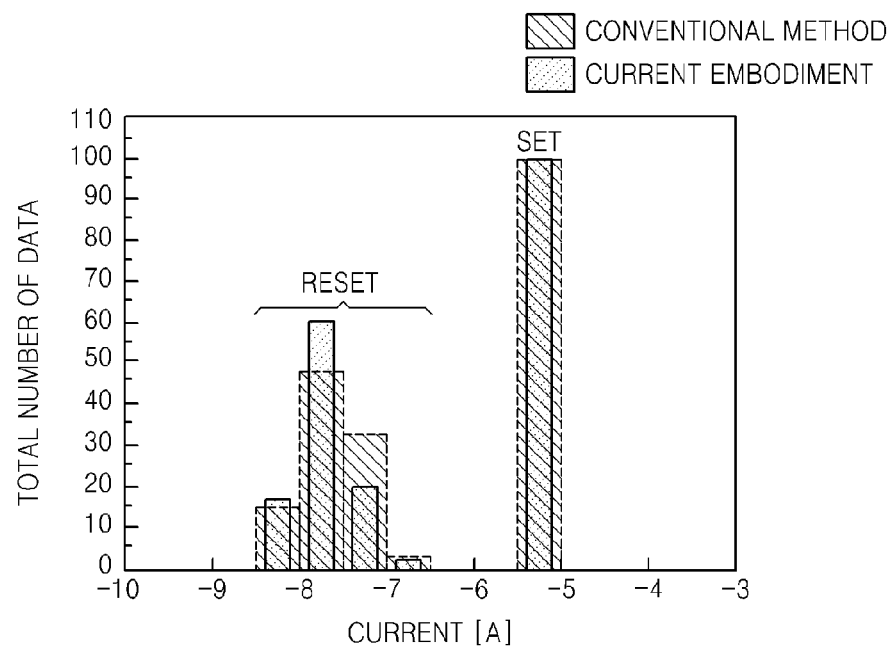
FIG. 10 is a graph showing dispersion of data versus the amount of current flowing through a variable resistance device when whether the amount of reset current falls within a predetermined range of current is determined according to the graph of FIG. 9.

FIG. 10 is a graph showing dispersion of data versus the amount of current flowing through a variable resistance device when whether the amount of reset current falls within a predetermined range of current is determined according to the graph of FIG. 9. In FIG. 10, the X-axis denotes the amount of current flowing through the variable resistance device in a log scale (A), and the Y-axis denotes the total number of pieces of data corresponding to the amount of current. In the graph of FIG. 10, shaded regions denote the dispersion of data versus the amount of current flowing through the variable resistance device according to a conventional method, and dotted regions denote the dispersion of data versus the amount of current flowing through the variable resistance device according to an embodiment of the present invention.

In the current embodiment, when the set voltage $V_{SET}$ is applied, it is not determined whether the set voltage $V_{SET}$ falls within a predetermined range of current, and thus, the dispersion of data is not greatly different from in the conventional method. In the current embodiment, when the reset voltage $V_{RESET}$ is applied, it is determined whether the reset voltage $V_{RESET}$ falls within a predetermined range of current, and the reset voltage $V_{RESET}$ is additionally applied when it is determined that the reset voltage $V_{RESET}$ does not fall within the predetermined range of current. In this case, the dispersion of data according to the current embodiment is better than in the conventional method.

Figure 11:
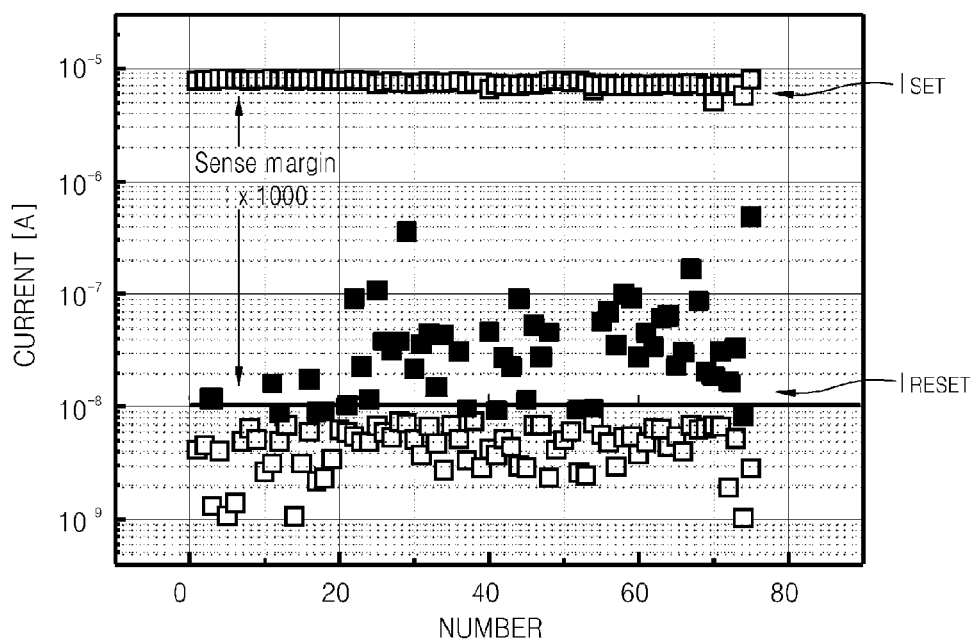
FIG. 11 is a graph showing current flowing through a variable resistance device so as to explain operation 140 included in the method of FIG. 7, according to another embodiment of the present invention.

FIG. 11 is a graph showing current flowing through the variable resistance device of FIG. 1 so as to explain operation 140 included in the method of FIG. 7, according to another embodiment of the present invention. In FIG. 11, the X-axis denotes a number of times that the set cycle or the reset cycle is performed, and the Y-axis denotes the amount of current (A). Current flowing through the variable resistance device 10 after the set cycle, i.e., current sensed when the set voltage $V_{SET}$ and the read voltage $V_{SET}$ are sequentially applied to the variable resistance device 10, is referred to as set current $I_{SET}$. Also, current flowing through the variable resistance device 10 after the reset cycle, i.e., current sensed when the reset voltage $V_{RESET}$ and the read voltage $V_{READ}$ are sequentially applied to the variable resistance device 10, is referred to as reset current $I_{RESET}$. For example, the set voltage $V_{SET}$ may be about −5 V and may be applied for about 1 μs, and the reset voltage $V_{RESET}$ may be about 7 V and may be applied for about 1 μs.

In the current embodiment, when it is determined whether the reset current $I_{RESET}$ falls within a first range of current $I_1$, in operation 140, it may be determined whether the difference between 'on' current flowing through the variable resistance device 10 and the sensed reset current $I_{RESET}$ when the variable resistance device 10 is 'on', i.e., a sensing margin, is equal to or greater than a predetermined level. For example, the predetermined level may be about 1000 times.

If the difference between the 'on' current flowing through the variable resistance device 10 and the sensed current reset current $I_{RESET}$ is equal to or greater than the predetermined level, it is determined that the sensed reset current $I_{RESET}$ falls within the first range of current $I_1$. In FIG. 11, a case where the sensed reset current $I_{RESET}$ falls within the first range of current $I_1$ is indicated using '□'. If the difference between the 'on' current flowing through the variable resistance device 10 and the sensed current reset current $I_{RESET}$ is less than the predetermined level, it may be determined that the sensed reset current $I_{RESET}$ does not fall within the first range of current $I_1$. In FIG. 11, a case where the sensed reset current $I_{RESET}$ does not fall within the first range of current $I_1$ is indicated using '■'.

Figure 12:
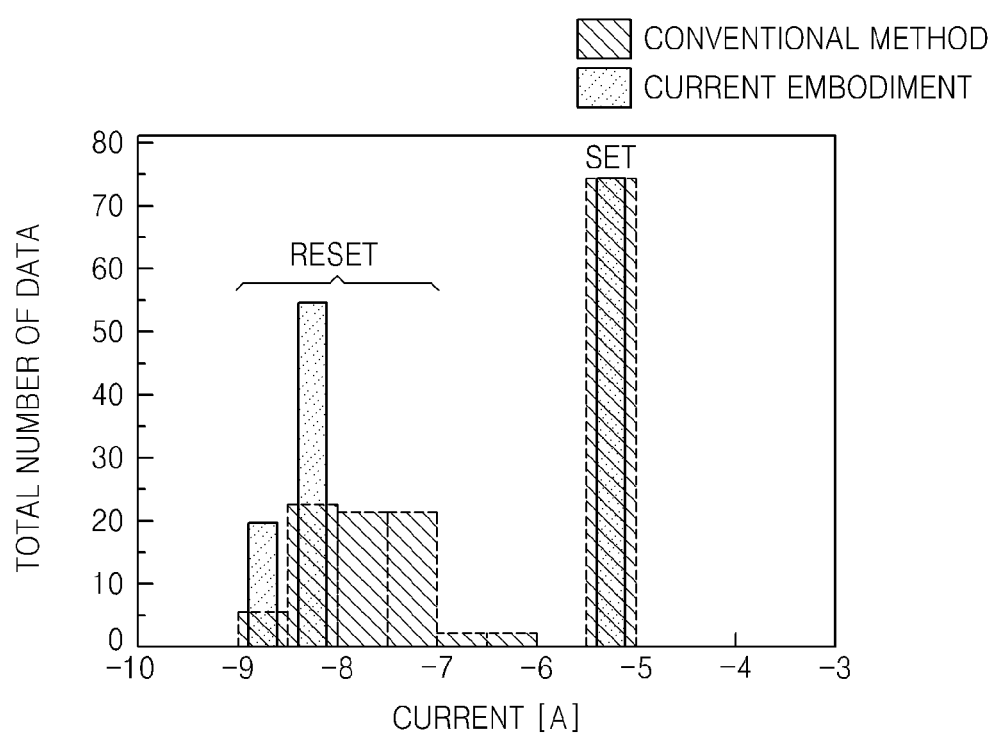
FIG. 12 is a graph showing dispersion of data versus the amount of current flowing through a variable resistance device when whether the amount of reset current falls within a predetermined range of current is determined according to the graph of FIG. 11.

FIG. 12 is a graph showing dispersion of data versus the amount of current flowing through the variable resistance device 10 of FIG. 1 when whether the amount of reset current falls within a predetermined range of current is determined according to the graph of FIG. 11. In FIG. 12, the X-axis denotes the amount of current flowing through the variable resistance device 10 in a log scale (A), and the Y-axis denotes the total number of pieces of data corresponding to the amount of current. In the graph of FIG. 12, shaded regions denote the dispersion of data versus the amount of current flowing through the variable resistance device according to a conventional method, and dotted regions denote the dispersion of data versus the amount of current flowing through the variable resistance device according to an embodiment of the present invention.

In the current embodiment, when the set voltage $V_{SET}$ is applied, it is not determined whether the set voltage $V_{SET}$ falls within a predetermined range of current, and thus, the dispersion of data is not greatly different from in the conventional method. In the current embodiment, when the reset voltage $V_{RESET}$ is applied, it is determined whether the reset voltage $V_{RESET}$ falls within a predetermined range of current, and the reset voltage $V_{RESET}$ is additionally applied when it is determined that the reset voltage $V_{RESET}$ does not fall within the predetermined range of current. In this case, the dispersion of data according to the current embodiment is better than in the conventional method. Accordingly, a sufficient sensing margin may be secured between the set current $I_{SET}$, i.e., the 'on' current, and the reset current $I_{RESET}$, i.e., the 'off' current.

Figure 13:
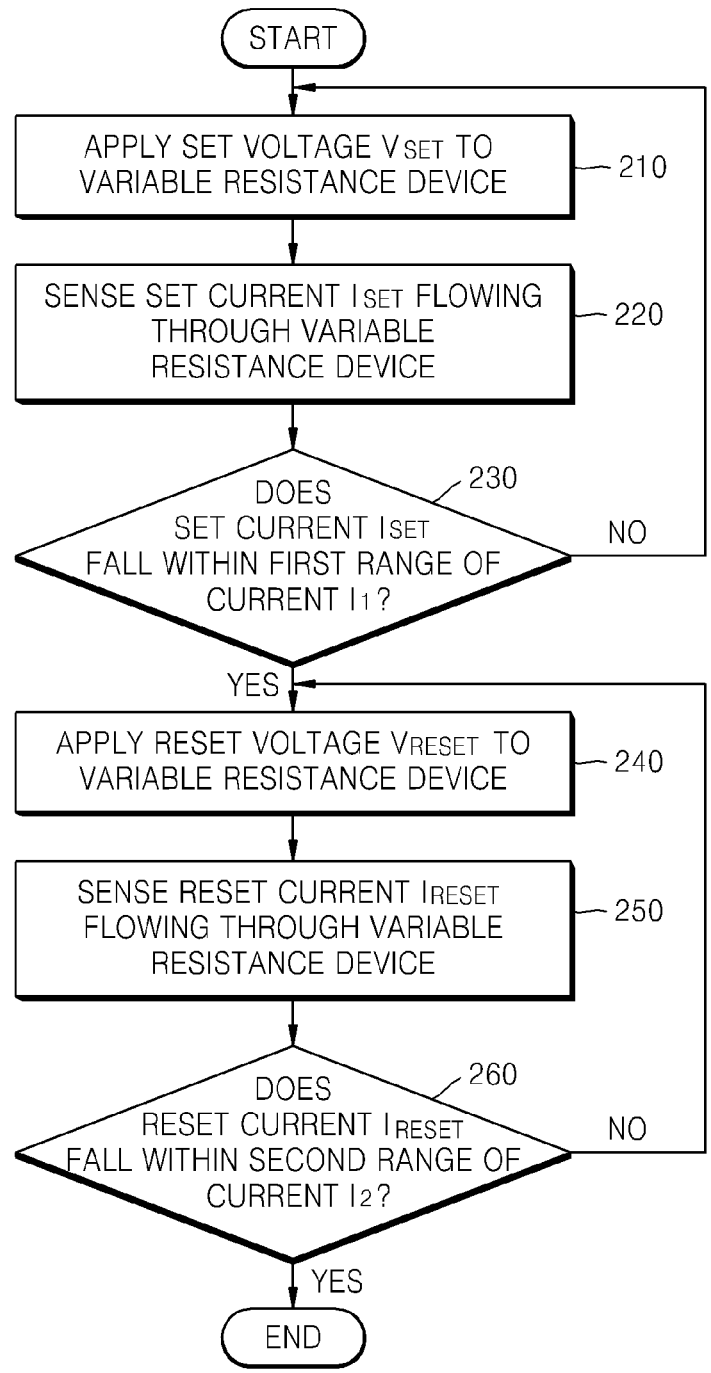
FIG. 13 is a flowchart illustrating a method of operating a semiconductor device that includes a variable resistance device, according to another embodiment of the present invention.
Figure 14:
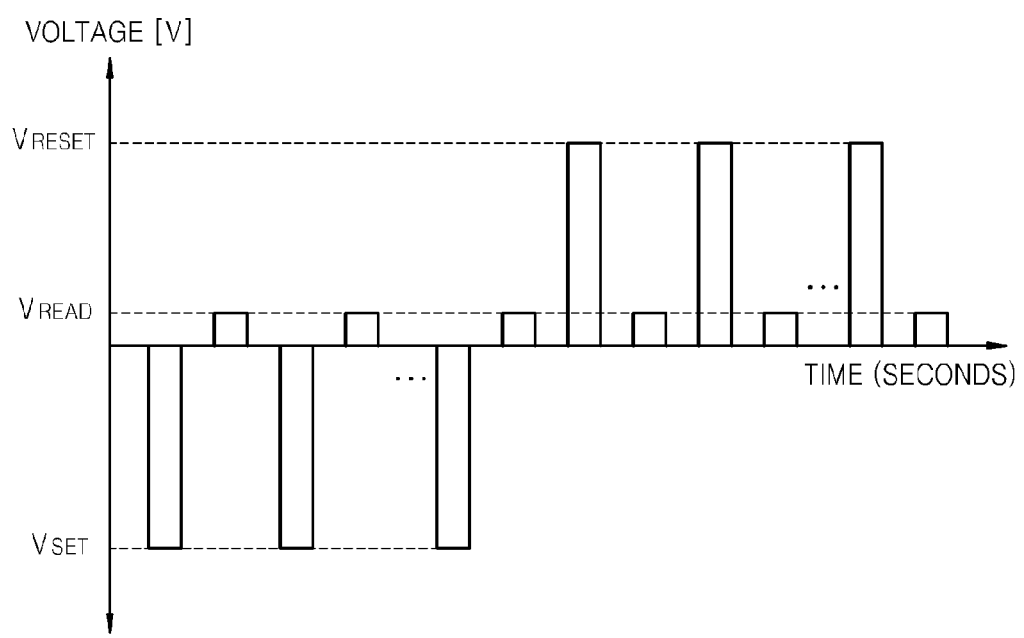
FIG. 14 is a graph showing an example of operating voltages applied to a semiconductor device according to the method of FIG. 13.

FIG. 13 is a flowchart illustrating a method of operating a semiconductor device that includes a variable resistance device, according to another embodiment of the present invention. FIG. 14 is a graph showing an example of operating voltages applied to a semiconductor device according to the method of FIG. 13.

Referring to FIGS. 13 and 14, in the method according to the current embodiment, a semiconductor device that includes the variable resistance device 10 of FIG. 1 may be operated. The method according to the current embodiment may be described, for example, in relation to the variable resistance device 10 of FIG. 1. In the current embodiment, it is assumed that the variable resistance device 10 is used in a multi-bit non-volatile memory device. In FIG. 14, the X-axis denotes time (seconds) and the Y-axis denotes operating voltages (V) applied to the semiconductor device.

In operation 210, a set voltage $V_{SET}$ is applied to the variable resistance device 10. The set voltage $V_{SET}$ may correspond to the set voltage $V_{SET}$ illustrated in FIG. 10. The set voltage $V_{SET}$ illustrated in FIG. 14 may be a negative voltage, e.g., about −3.0 V.

In operation 220, reset current $I_{RESET}$ flowing through the variable resistance device 10 to which the set voltage $V_{SET}$ is applied, is sensed. Specifically, the read voltage $V_{READ}$ may be applied to the variable resistance device 10 to which the set voltage $V_{SET}$ is applied, and then the set current $I_{SET}$ flowing through the variable resistance device 10 may be sensed. The read voltage $V_{READ}$ may correspond to the read voltage $V_{READ}$ of FIG. 14. The read voltage $V_{READ}$ illustrated in FIG. 14 may be a positive voltage, e.g., about 0.5 V.

In operation 230, it is determined whether the sensed set current $I_{SET}$ falls within a first range of current $I_1$. The first range of current $I_1$ may be preset to improve the dispersion of the set current $I_{SET}$ flowing through the variable resistance device 10, i.e., the 'on' current. In detail, the first range of current $I_1$ may be preset to secure a sufficient sensing margin between the 'on' current and the 'off' current of the variable resistance device 10.

If it is determined in operation 230 that the sensed set current $I_{SET}$ falls within the first range of current $I_1$, operation 240 is performed. If it is determined in operation 230 that the sensed set current $I_{SET}$ does not fall within the first range of current $I_1$, operation 210 is performed. If the sensed set current $I_{SET}$ does not fall within the first range of current $I_1$, operation 210 may be performed to additionally apply the set voltage $V_{SET}$ to the variable resistance device 10. The additionally applied set voltage $V_{SET}$ may correspond to the set voltage $V_{SET}$ illustrated in FIG. 14. Thus, the additionally applied set voltage $V_{SET}$ may be equal to and have the same pulse width as the set voltage $V_{SET}$.

In operation 240, a reset voltage $V_{RESET}$ is applied to the variable resistance device 10. The reset voltage $V_{RESET}$ may correspond to the reset voltage $V_{RESET}$ illustrated in FIG. 14. The reset voltage $V_{RESET}$ illustrated in FIG. 14 may be a positive voltage and may be higher than the read voltage $V_{READ}$.

When the variable resistance device 10 is used in a multi-bit non-volatile memory device, first to third reset voltages may be applied to write different data '01', '10', and '00' corresponding to the 'off' state, respectively. For example, the first reset voltage for writing data '01' to the multi-bit non-volatile memory device may be about 3.2 V, the second reset voltage for writing data '10' to the multi-bit non-volatile memory device may be about 3.3 V, and the third reset voltage for writing data '00' to the multi-bit non-volatile memory device may be about 3.4 V.

In operation 250, reset current $I_{RESET}$ flowing through the variable resistance device 10 to which the reset voltage $V_{RESET}$ is applied, is sensed. Specifically, the read voltage $V_{READ}$ may be applied to the variable resistance device 10 to which the reset voltage $V_{RESET}$ is applied, and then the reset current $I_{RESET}$ flowing through the variable resistance device 10 may be sensed. The read voltage $V_{READ}$ may correspond to the read voltage $V_{READ}$ of FIG. 14. The read voltage $V_{READ}$ illustrated in FIG. 14 may be a positive voltage, e.g., about 0.5 V.

In operation 260, it is determined whether the sensed reset current $I_{RESET}$ falls within a second range of current $I_2$. The second range of current $I_2$ may be preset to improve the dispersion of the reset current $I_{RESET}$ flowing through the variable resistance device 10, i.e., the 'off' current. In detail, the second range of current $I_2$ may be preset to secure a sufficient sensing margin between the 'on' current and the 'off' current of the variable resistance device 10. In operation 260, the embodiments described above with reference to FIGS. 9 to 12 may be performed.

The method ends when it is determined in operation 260 that the sensed reset current $I_{RESET}$ falls within the second range of current $I_2$. Operation 240 is performed when the sensed reset current $I_{RESET}$ does not fall within the second range of current $I_2$. If the sensed reset current $I_{RESET}$ does not fall within the second range of current $I_2$, operation 240 may be performed to additionally apply the reset voltage $V_{RESET}$ to the variable resistance device 10. The additionally applied reset voltage $V_{RESET}$ may correspond to the reset voltage $V_{RESET}$ illustrated in FIG. 14. Thus, the additionally applied reset voltage $V_{RESET}$ may be equal to and have the same pulse width as the reset voltage $V_{RESET}$.

Figure 15:
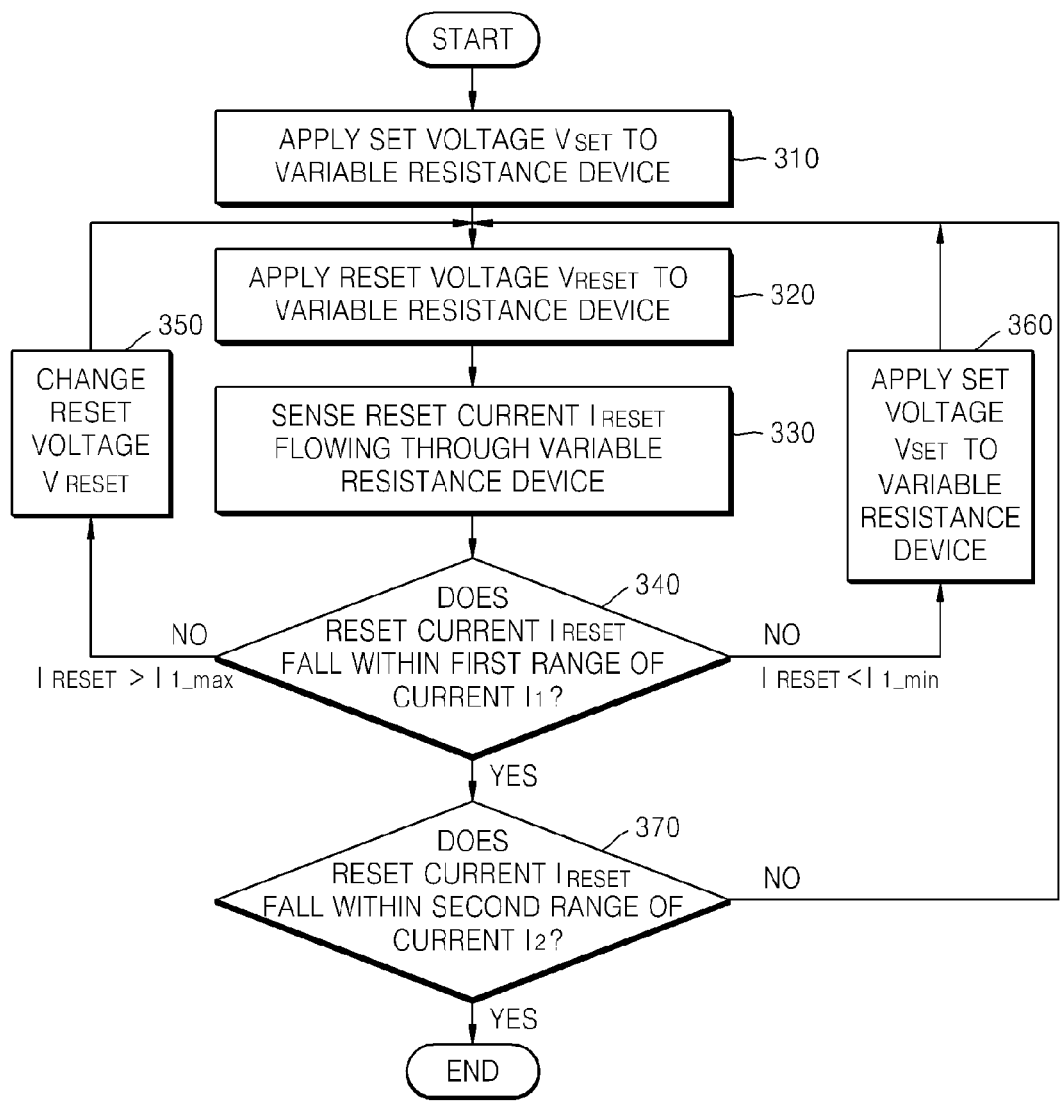
FIG. 15 is a flowchart illustrating a method of operating a semiconductor device that includes a variable resistance device, according to another embodiment of the present invention.
Figure 16:
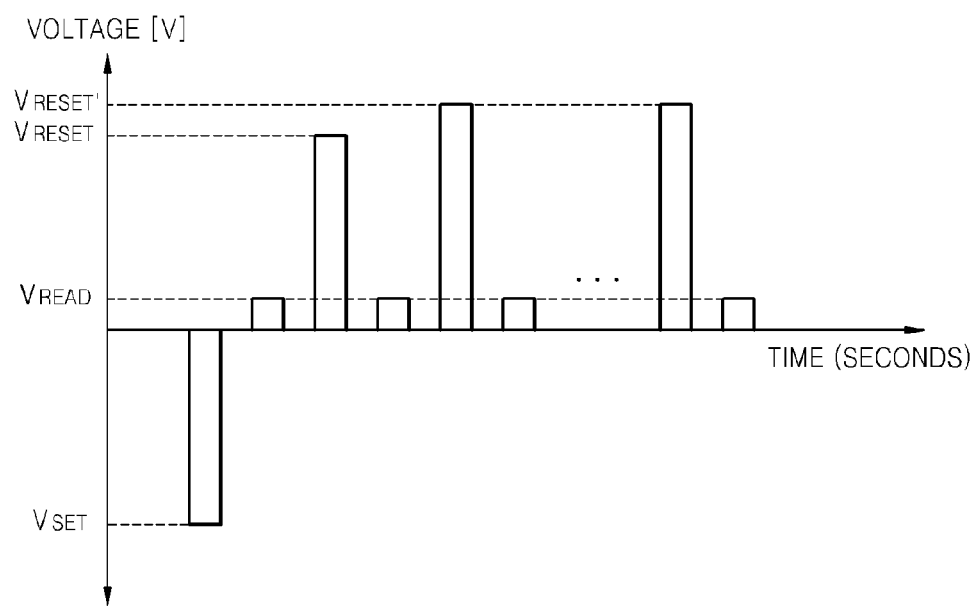
FIG. 16 is a graph showing an example of operating voltages applied to a semiconductor device according to the method of FIG. 15.
Figure 17:
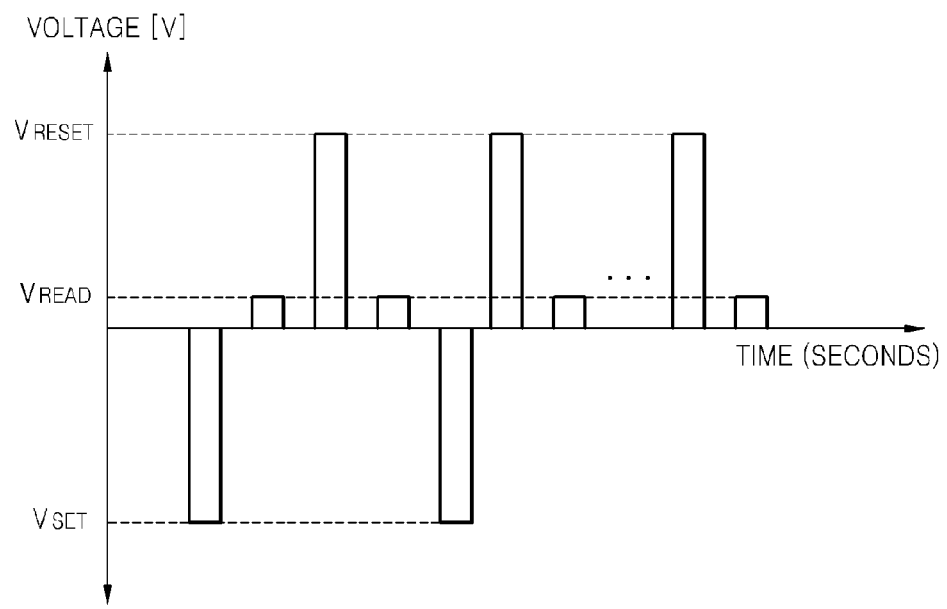
FIG. 17 is a graph showing another example of operating voltages applied to a semiconductor device according to the method of FIG. 15.

FIG. 15 is a flowchart illustrating a method of operating a semiconductor device that includes a variable resistance device, according to another embodiment of the present invention. FIG. 16 is a graph showing an example of operating voltages applied to a semiconductor device according to the method of FIG. 15. FIG. 17 is a graph showing another example of operating voltages applied to a semiconductor device according to the method of FIG. 15.

Referring to FIGS. 15 to 17, in the method according to the current embodiment, a semiconductor device that includes the variable resistance device 10 of FIG. 1 may be operated. The method according to the current embodiment may be described, for example, in relation to the variable resistance device 10 of FIG. 1. In the current embodiment, it is assumed that the variable resistance device 10 is used in a multi-bit non-volatile memory device. In FIGS. 16 and 17, the X-axis denotes time (seconds) and the Y-axis denotes operating voltages (V) applied to the semiconductor device.

In operation 310, a set voltage $V_{SET}$ is applied to the variable resistance device 10. The set voltage $V_{SET}$ may correspond to the set voltage $V_{SET}$ illustrated in FIGS. 16 and 17. The set voltage $V_{SET}$ illustrated in FIG. 16 may be a negative voltage, e.g., about −3.0 V.

In operation 320, a reset voltage $V_{RESET}$ is applied to the variable resistance device 10. The reset voltage $V_{RESET}$ may correspond to the reset voltage $V_{RESET}$ illustrated in FIGS. 16 and 17. The reset voltage $V_{RESET}$ illustrated in FIGS. 16 and 17 may be a positive voltage and may be higher than the read voltage $V_{READ}$.

When the variable resistance device 10 is used in a multi-bit non-volatile memory device, first to third reset voltages may be applied to write different data '01', '10', and '00' corresponding to the 'off' state, respectively. For example, the first reset voltage for writing data '01' to the multi-bit non-volatile memory device may be about 3.2 V, the second reset voltage for writing data '10' to the multi-bit non-volatile memory device may be about 3.3 V, and the third reset voltage for writing data '00' to the multi-bit non-volatile memory device may be about 3.4 V.

In operation 330, reset current $I_{RESET}$ flowing through the variable resistance device 10 to which the reset voltage $V_{RESET}$ is applied, is sensed. Specifically, the read voltage $V_{READ}$ may be applied to the variable resistance device 10 to which the reset voltage $V_{RESET}$ is applied, and then the reset current $I_{RESET}$ flowing through the variable resistance device 10 may be sensed. The read voltage $V_{READ}$ may correspond to the read voltage $V_{READ}$ of FIGS. 16 and 17. The read voltage $V_{READ}$ illustrated in FIGS. 16 and 17 may be a positive voltage, e.g., about 0.5 V.

In operation 340, it is determined whether the sensed reset current $I_{RESET}$ falls within a first range of current $I_1$. Here, the first range of current $I_1$ may be a range of data to be written. If the variable resistance device 10 is used in a multi-bit memory device, then the first range of current $I_1$ may be the range of current flowing through the multi-bit memory device to which data '01' is written when data that is to be written is '01', may be the range of current flowing through the multi-bit memory device to which data '10' is written when the data that is to be written is '10', and may be the range of current flowing through the multi-bit memory device to which data '00' is written when the data that is to be written is '00'.

If it is determined in operation 340 that the sensed reset current $I_{RESET}$ is greater than a maximum value $I_{1\_max}$ in the first range of current $I_1$, operation 350 is performed. If it is determined in operation 340 that the sensed reset current $I_{RESET}$ is less than a minimum value $I_{1\_min}$ in the first range of current $I_1$, operation 360 is performed. If it is determined in operation 340 that the sensed reset current $I_{RESET}$ falls within the first range of current $I_1$, operation 370 is performed.

In operation 350, a reset voltage $V_{RESET}$ that is to be applied to the variable resistance device 10 is changed. The changed reset voltage $V_{RESET}$ may correspond to the reset voltage $V_{RESET}'$ illustrated in FIG. 16. Specifically, if it is determined in operation 340 that the sensed reset current $I_{RESET}$ is greater than the maximum value $I_{1\_max}$, it may be understood that the applied reset voltage $V_{RESET}$ is not sufficient to program data that is to be written to the variable resistance device 10. In this case, the changed reset voltage $V_{RESET}'$ changed to be higher than the reset voltage $V_{RESET}$ may be applied to the variable resistance device 10.

In operation 360, a set voltage $V_{SET}$ is applied to the variable resistance device 10. The set voltage $V_{SET}$ may correspond to the set voltage $V_{SET}$ illustrated in FIG. 17. Specifically, if it is determined in operation 340 that the sensed reset current $I_{RESET}$ is less than the minimum value $I_{1\_min}$, the set voltage $V_{SET}$ may be additionally applied to the variable resistance device 10. The set voltage $V_{SET}$ may correspond to the set voltage $V_{SET}$ illustrated in FIG. 17.

In operation 370, it is determined whether the sensed reset current $I_{RESET}$ falls within a second range of current $I_2$. The second range of current $I_2$ may be preset to improve the dispersion of the reset current $I_{RESET}$ flowing through the variable resistance device 10, i.e., the 'off' current. In detail, the second range of current $I_2$ may be preset to secure a sufficient sensing margin between the 'on' current and the 'off' current of the variable resistance device 10. In operation 370, the embodiments described above with reference to FIGS. 9 to 12 may be performed.

The method ends when it is determined in operation 370 that the sensed reset current $I_{RESET}$ falls within the second range of current $I_2$. Operation 320 is performed when the sensed reset current $I_{RESET}$ does not fall within the second range of current $I_2$. If the sensed reset current $I_{RESET}$ does not fall within the second range of current $I_2$, operation 320 may be performed to additionally apply the reset voltage $V_{RESET}$ to the variable resistance device 10. The additionally applied reset voltage $VRE_{RESET}$ may correspond to the reset voltage $V_{RESET}$ illustrated in FIGS. 16 and 17. Thus, the additionally applied reset voltage $V_{RESET}$ may be equal to and have the same pulse width as the reset voltage $V_{RESET}$.

Figure 18:
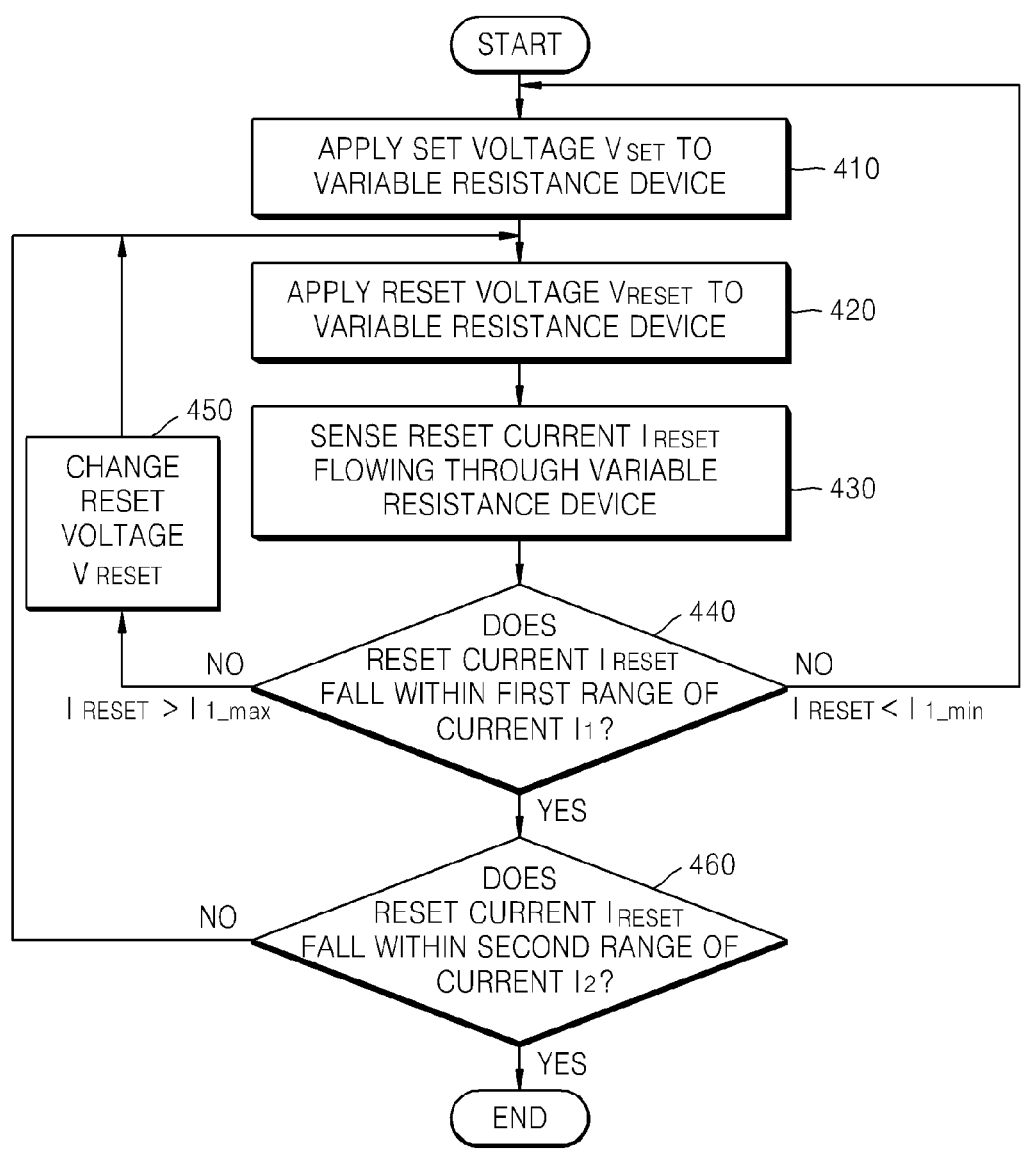
FIG. 18 is a flowchart illustrating a method of operating a semiconductor device that includes a variable resistance device, according to another embodiment of the present invention.
Figure 19:
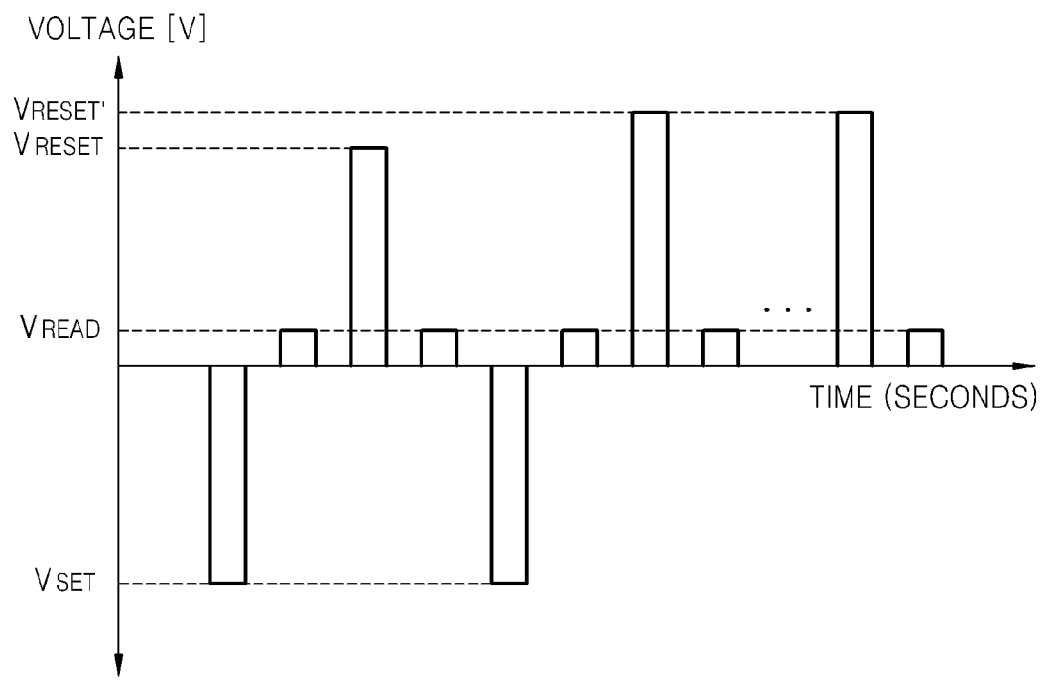
FIG. 19 is a graph showing an example of operating voltages applied to a semiconductor device according to the method of FIG. 18.

FIG. 18 is a flowchart illustrating a method of operating a semiconductor device that includes a variable resistance device, according to another embodiment of the present invention. FIG. 19 is a graph showing an example of operating voltages applied to a semiconductor device according to the method of FIG. 18.

Referring to FIGS. 18 and 19, in the method according to the current embodiment, a semiconductor device that includes the variable resistance device 10 of FIG. 1 may be operated. The method according to the current embodiment will now be described, for example, in relation to the variable resistance device 10 of FIG. 1. In the current embodiment, it is assumed that the variable resistance device 10 is used in a multi-bit non-volatile memory device. In FIG. 19, the X-axis denotes time (seconds) and the Y-axis denotes operating voltages (V) applied to the semiconductor device.

In operation 410, a set voltage $V_{SET}$ is applied to the variable resistance device 10. The set voltage $V_{SET}$ may correspond to the set voltage $V_{SET}$ illustrated in FIG. 19. The set voltage $V_{SET}$ illustrated in FIG. 19 may be a negative voltage, e.g., about −3.0 V. In operation 420, a reset voltage $V_{RESET}$ is applied to the variable resistance device 10. The reset voltage $V_{RESET}$ may correspond to the reset voltage $V_{RESET}$ illustrated in FIG. 19. The reset voltage $V_{RESET}$ illustrated in FIG. 19 may be a positive voltage and may be higher than the read voltage $V_{READ}$.

If the variable resistance device 10 is used in a multi-bit non-volatile memory device, first to third reset voltages may be applied to write different data '01', '10', and '00' corresponding to the 'off' state. For example, the first reset voltage for writing data '01' to the multi-bit non-volatile memory device may be about 3.2 V, the second reset voltage for writing data '10' to the multi-bit non-volatile memory device may be about 3.3 V, and the third reset voltage for writing data '00' to the multi-bit non-volatile memory device may be about 3.4 V.

In operation 430, reset current $I_{RESET}$ flowing through the variable resistance device 10 to which the reset voltage $V_{RESET}$ is applied, is sensed. Specifically, the read voltage $V_{READ}$ may be applied to the variable resistance device 10 to which the reset voltage $V_{RESET}$ is applied, and then the reset current $I_{RESET}$ flowing through the variable resistance device 10 may be sensed. The read voltage $V_{READ}$ may correspond to the read voltage $V_{READ}$ of FIG. 19. The read voltage $V_{READ}$ illustrated in FIG. 19 may be a positive voltage, e.g., about 0.5 V.

In operation 440, it is determined whether the sensed reset current $I_{RESET}$ falls within a first range of current $I_1$. Here, the first range of current $I_1$ may be a range of data to be written. If the variable resistance device 10 is used in a multi-bit memory device, then the first range of current $I_1$ may be the range of current flowing through the multi-bit memory device to which data '01' is written when data that is to be written is '01', may be the range of current flowing through the multi-bit memory device to which data '10' is written when the data that is to be written is '10', and may be the range of current flowing through the multi-bit memory device to which data '00' is written when the data that is to be written is '00'.

If it is determined in operation 440 that the sensed reset current $I_{RESET}$ is greater than a maximum value $I_{1\_max}$ in the first range of current $I_1$, operation 450 is performed. If it is determined in operation 440 that the sensed reset current $I_{RESET}$ is less than a minimum value $I_{1\_min}$ in the first range of current $I_1$, operation 410 is performed. If it is determined in operation 440 that the sensed reset current $I_{RESET}$ falls within the first range of current $I_1$, operation 460 is performed.

In operation 450, the reset voltage $V_{RESET}$ that is to be applied to the variable resistance device 10 is changed. The changed reset voltage $V_{RESET}'$ may correspond to the reset voltage $V_{RESET}'$ illustrated in FIG. 19. Specifically, if it is determined in operation 440 that the sensed reset current $I_{RESET}$ is greater than the maximum value $I_{1\_max}$, it may be understood that the applied reset voltage $V_{RESET}$ is not sufficient to program data that is to be written to the variable resistance device 10. In this case, the changed reset voltage $V_{RESET}'$ changed to be higher than the reset voltage $V_{RESET}$ may be applied to the variable resistance device 10.

Specifically, if it is determined in operation 440 that the sensed reset current $I_{RESET}$ is less than the minimum value $I_{1\_min}$, the set voltage $V_{SET}$ may be applied to the variable resistance device 10. The set voltage $V_{SET}$ may correspond to the set voltage $V_{SET}$ illustrated in FIG. 19.

In operation 460, it is determined whether the sensed reset current $I_{RESET}$ falls within a second range of current $I_2$. The second range of current $I_2$ may be preset to improve the dispersion of the reset current $I_{RESET}$ flowing through the variable resistance device 10, i.e., the 'off' current. In detail, the second range of current $I_2$ may be preset to secure a sufficient sensing margin between the 'on' current and the 'off' current of the variable resistance device 10. In operation 460, the embodiments described above with reference to FIGS. 9 to 12 may be performed.

The method ends when it is determined that the sensed reset current $I_{RESET}$ falls within the second range of current $I_2$. Operation 420 is performed when the sensed reset current $I_{RESET}$ does not fall within the second range of current $I_2$. If the sensed reset current $I_{RESET}$ does not fall within the second range of current $I_2$, operation 420 may be performed to apply an additional reset voltage $V_{RESET}$ to the variable resistance device 10.

The additional reset voltage $V_{RESET}$ may correspond to the reset voltage $V_{RESET}$ or the changed reset voltage $V_{RESET}'$ illustrated in FIG. 19. Specifically, if it is determined in operation 440 that the sensed reset current $I_{RESET}$ falls within the first range of current $I_1$, the additional reset voltage $V_{RESET}$ may correspond to the reset voltage $V_{RESET}$ illustrated in FIG. 19. Thus, the additional reset voltage $V_{RESET}$ may be equal to and have the same pulse width as the reset voltage $V_{RESET}$. When operation 450 is performed since the sensed reset current $I_{RESET}$ does not fall within the first range of current $I_1$, then the additional reset voltage $V_{RESET}$ may correspond to the changed reset voltage $V_{RESET}'$ illustrated in FIG. 19. Thus, the additional reset voltage $V_{RESET}$ may be equal to and have the same pulse width as the changed reset voltage $V_{RESET}'$.

Methods of operating a semiconductor memory device according to various embodiments of the present invention when the variable resistance device 10 of FIG. 1 is used in a multi-bit non-volatile memory device, have been described above in detail. However, methods of operating a semiconductor memory device according to various embodiments of the present invention may also be performed when the variable resistance device of FIG. 1 is used in a single-bit non-volatile memory device. If the variable resistance device 10 is used in a single-bit non-volatile memory device, the reset voltage $V_{RESET}$ may be, for example, about 3.0 V.

Figure 20:
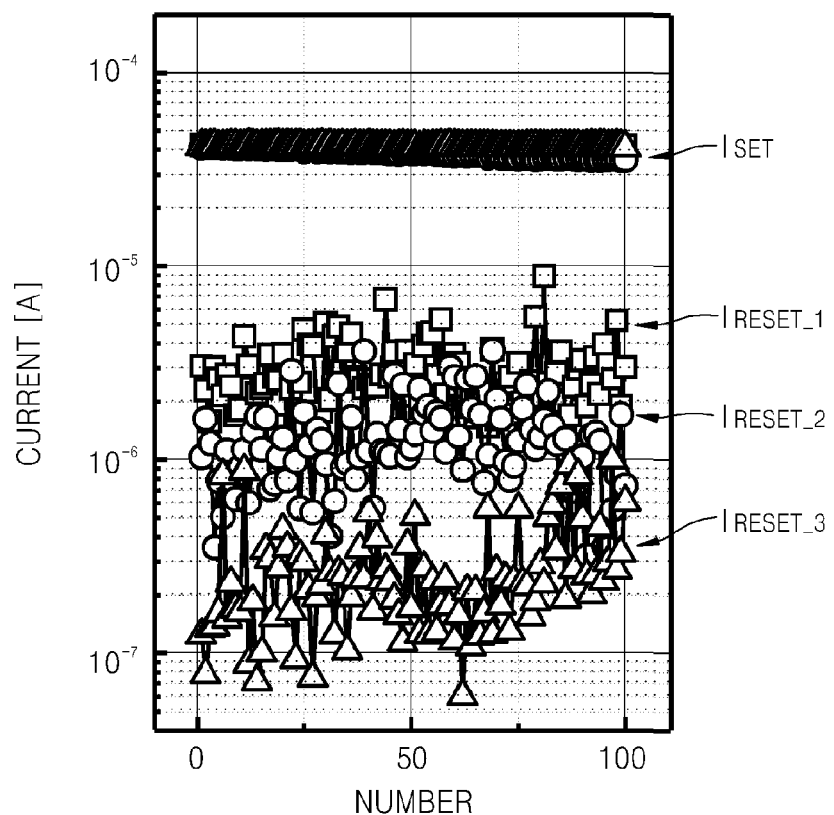
FIG. 20 is a graph showing a distribution of the amount of current flowing through a variable resistance device included in a semiconductor device when the semiconductor device is operated according to a conventional method.

FIG. 20 is a graph showing a distribution of the amount of current flowing through a variable resistance device included in a semiconductor device when the semiconductor device is operated according to a conventional method. In FIG. 20, the X-axis denotes a number of times that the set cycle or the reset cycle is performed, and the Y-axis denotes a distribution of the amount of current (A). In FIG. 20, set current $I_{SET}$ denotes current flowing through the variable resistance device when a set voltage $V_{SET}$ is applied thereto. For example, the set voltage $V_{SET}$ may be about –3.0 V, and in this case, data '11' may be written to the semiconductor device. In FIG. 20, first reset current $I_{RESET\_1}$ is indicated using '□', and denotes current flowing through the variable resistance device when first reset voltage $V_{RESET\_1}$ is applied thereto. For example, the first reset voltage $V_{RESET\_1}$ may be about 3.2 V, and in this case, data '01' may be written to the semiconductor device. In FIG. 20, second reset current $I_{RESET\_2}$ is indicated using '○', and denotes current flowing through the variable resistance device when second reset voltage $V_{RESET\_2}$ is applied thereto. For example, the second reset voltage $V_{RESET\_2}$ may be about 3.3 V, and in this case, data '10' may be written to the semiconductor device. Third reset current $I_{RESET\_3}$ is indicated using ' ', and denotes current flowing through the variable resistance device when third reset voltage $V_{RESET\_3}$ is applied thereto. For example, the third reset voltage $V_{RESET\_3}$ may be about 3.4 V, and in this case, data '00' may be written to the semiconductor device.

Referring to FIG. 20, the set current $I_{SET}$ is maintained at a constant level, but the first to third reset currents $I_{RESET\_1}$, $I_{RESET\_2}$, and $I_{RESET\_3}$ have a very large dispersion. Accordingly, a sufficient sensing margin may not be secured between the first reset current $I_{RESET\_1}$ and the second reset current $I_{RESET\_2}$, thereby preventing data '01' or '10' from being efficiently written to the semiconductor device. Also, a sufficient sensing margin may not be secured between the second reset current $I_{RESET\_2}$ and the third reset current $I_{RESET\_3}$, thereby preventing data '10' or '00' from being efficiently written to the semiconductor device.

Figure 21:
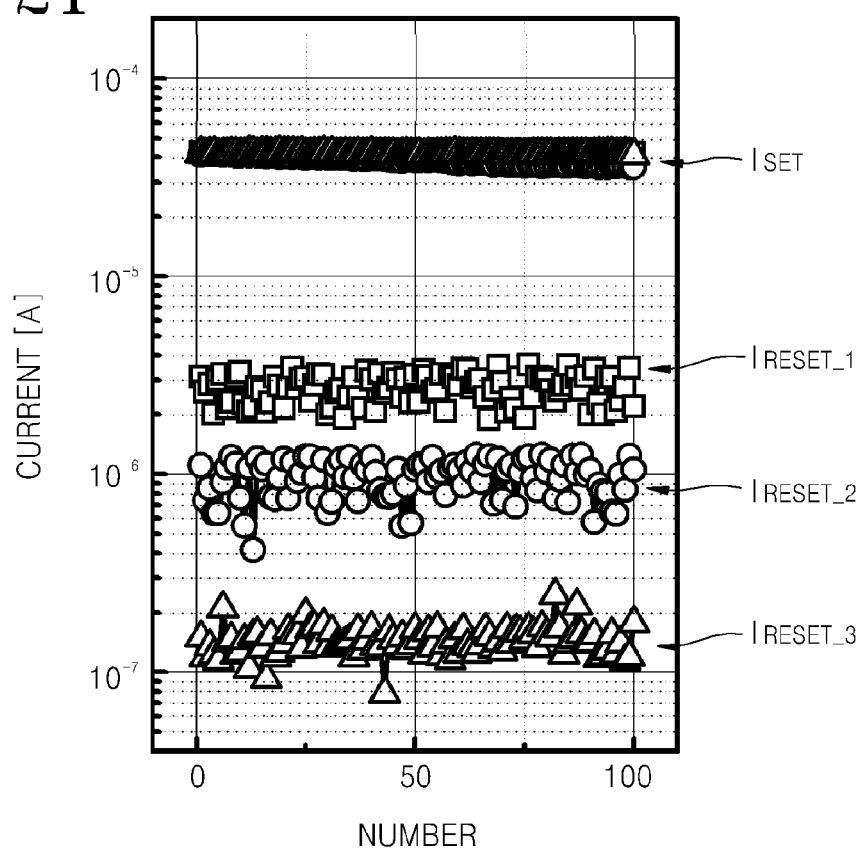
FIG. 21 is a graph showing a distribution of the amount of current flowing through a variable resistance device included in a semiconductor device when the semiconductor device is operated according to a method according to an embodiment of the present invention.

FIG. 21 is a graph showing a distribution of the amount of current flowing through a variable resistance device included in a semiconductor device when the semiconductor device is operated according to a method according to an embodiment of the present invention. In FIG. 21, the X-axis denotes a number of times that the set cycle or the reset cycle is performed, and the Y-axis denotes a distribution of the amount of current (A). In FIG. 20, set current $I_{SET}$ denotes current flowing through the variable resistance device when a set voltage $V_{SET}$ is applied thereto. For example, the set voltage $V_{SET}$ may be about –3.0 V, and in this case, data '11' may be written to the semiconductor device. In FIG. 21, first reset current $I_{RESET\_1}$ is indicated using '0', and denotes current flowing through the variable resistance device when first reset voltage $V_{RESET\_1}$ is applied thereto. For example, the first reset voltage $V_{RESET\_1}$ may be about 3.2 V, and in this case, data '01' may be written to the semiconductor device. Second reset current $I_{RESET\_2}$ is indicated using '○', and denotes current flowing through the variable resistance device when second reset voltage $V_{RESET\_2}$ is applied thereto. For example, the second reset voltage $V_{RESET\_2}$ may be about 3.3 V, and in this case, data '10' may be written to the semiconductor device. Third reset current $I_{RESET\_3}$ is indicated using ' ', and denotes current flowing through the variable resistance device when third reset voltage $V_{RESET\_3}$ is applied thereto. For example, the third reset voltage $V_{RESET\_3}$ may be about 3.4 V, and in this case, data '00' may be written to the semiconductor device.

Referring to FIG. 21, the set current $I_{SET}$ is maintained at a constant level, and the dispersions of the first to third reset currents $I_{RESET\_1}$, $I_{RESET\_2}$, and $I_{RESET\_3}$ are reduced in comparison with the conventional method illustrated in FIG. 20. Accordingly, a sufficient sensing margin may be secured between the first reset current $I_{RESET\_1}$ and the second reset current $I_{RESET\_2}$, thereby allowing data '01' or '10' to be efficiently written to the semiconductor device. Also, a sufficient sensing margin may be secured between the second reset current $I_{RESET\_2}$ and the third reset current $I_{RESET\_3}$, thereby allowing data '10' or '00' to be efficiently written to the semiconductor device. Accordingly, according to the current embodiment, the dispersion of 'off' current of a variable resistance device may be improved, thereby greatly increasing the reliability of a semiconductor device that includes the variable resistance device.

Figure 22:
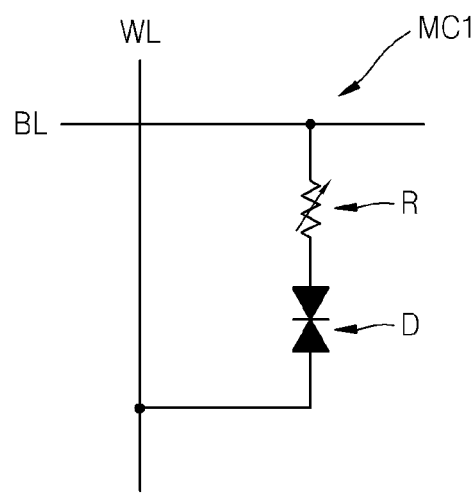
FIG. 22 is a circuit diagram of a semiconductor device that includes a variable resistance device, according to an embodiment of the present invention.

FIG. 22 is a circuit diagram of a semiconductor device that includes a variable resistance device R, according to an embodiment of the present invention. In FIG. 22, the semiconductor device may be, for example, a non-volatile memory device, and a unit cell MC1 thereof may include the variable resistance device R and a diode D. The variable resistance device R may be substantially the same as the variable resistance device 10 of FIG. 1. A first end of the variable resistance device R is connected to a bit line BL and a second end thereof is connected to the diode D. The diode D may operate bi-directionally, and may select the unit cell MC1 according to a voltage applied to a word line WL.

If the semiconductor device is a single-bit non-volatile memory device, then the variable resistance device R may be switched from a low resistance state to a high resistance state and data '0' may be written to the semiconductor device when the reset voltage is applied to the variable resistance device R, and may be switched from the high resistance state to the low resistance state and data '1' may be written to the semiconductor device when the set voltage is applied to the variable resistance device R. In this case, when data '0' is written to the semiconductor device, the reset voltage may be repeatedly applied to the variable resistance device R until the amount of current flowing through the variable resistance device R falls within a predetermined range of current.

If the semiconductor device is a multi-bit non-volatile memory device, then the variable resistance device R may be switched from the low resistance state to a first high resistance state and data '01' may be written to the semiconductor device when first reset voltage is applied to the variable resistance device R, may be switched to second high resistance state and data '10' may be written to the semiconductor device when second reset voltage higher than the first reset voltage is applied to the variable resistance device R, may be switched to third high resistance state and data '00' may be written to the semiconductor device when third reset voltage higher than the second reset voltage is applied to the variable resistance device R, and may be switched to the low resistance state and data '11' may be written to the semiconductor device when set voltage is applied to the variable resistance device R.

When data '01' is written to the semiconductor device, the first reset voltage may be repeatedly applied to the variable resistance device R until the amount of current flowing through the variable resistance device R to which the first reset voltage is applied falls within a first range of current. Also, when data '10' is written to the semiconductor device, the second reset voltage may be repeatedly applied to the variable resistance device R until the amount of current flowing through the variable resistance device R to which the second reset voltage is applied falls within the first range of current. Also, when data '00' is written to the semiconductor device, the third reset voltage may be repeatedly applied to the variable resistance device R until the amount of current flowing through the variable resistance device R to which the third reset voltage is applied falls within the first range of current.

Figure 23:
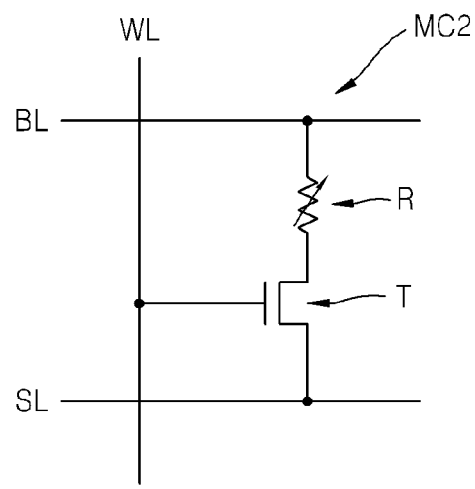
FIG. 23 is a circuit diagram of a semiconductor device that includes a variable resistance device, according to another embodiment of the present invention.

FIG. 23 is a circuit diagram of a semiconductor device that includes a variable resistance device, according to another embodiment of the present invention. Referring to FIG. 23, the semiconductor device may be, for example, a non-volatile memory device, and a unit cell MC2 thereof may include a variable resistance device R and an access transistor T. The variable resistance device R may be substantially the same as the variable resistance device 10 of FIG. 1. A first end of the variable resistance device R is connected to a bit line BL and a second end thereof is connected to the access transistor T. The access transistor T includes a gate connected to a word line WL, a drain connected to the second end of the variable resistance device R, and a source connected to a source line SL. The access transistor T may be switched on or off to select the unit cell MC2, according to a voltage applied to the word line WL.

If the semiconductor device is a single-bit non-volatile memory device, then the variable resistance device R may be switched from a low resistance state to a high resistance state and data '0' may be written to the semiconductor device when reset voltage is applied to the variable resistance device R, and may be switched from the high resistance state to the low resistance state and data '1' may be written to the semiconductor device when set voltage is applied to the variable resistance device R. In this case, when data '0' is written to the semiconductor device, the reset voltage may be repeatedly applied to the variable resistance device R until the amount of current flowing through the variable resistance device R falls within a predetermined range of current.

If the semiconductor device is a multi-bit non-volatile memory device, then the variable resistance device R may be switched from the low resistance state to a first high resistance state and data '01' may be written to the semiconductor device when first reset voltage is applied to the variable resistance device R, may be switched to second high resistance state and data '10' may be written to the semiconductor device when second reset voltage higher than the first reset voltage is applied to the variable resistance device R, may be switched to third high resistance state and data '00' may be written to the semiconductor device when third reset voltage higher than the second reset voltage is applied to the variable resistance device R, and may be switched to the low resistance state and data '11' may be written to the semiconductor device when set voltage is applied to the variable resistance device R.

When data '01' is written to the semiconductor device, the first reset voltage may be repeatedly applied to the variable resistance device R until the amount of current flowing through the variable resistance device R when the first reset voltage is applied falls within a first range of current. Also, when data '10' is written to the semiconductor device, the second reset voltage may be repeatedly applied to the variable resistance device R until the amount of current flowing through the variable resistance device R to which the second reset voltage is applied falls within the first range of current. Also, when data '00' is written to the semiconductor device, the third reset voltage may be repeatedly applied to the variable resistance device R until the amount of current flowing through the variable resistance device R to which the third reset voltage is applied falls within the first range of current.

Figure 24:
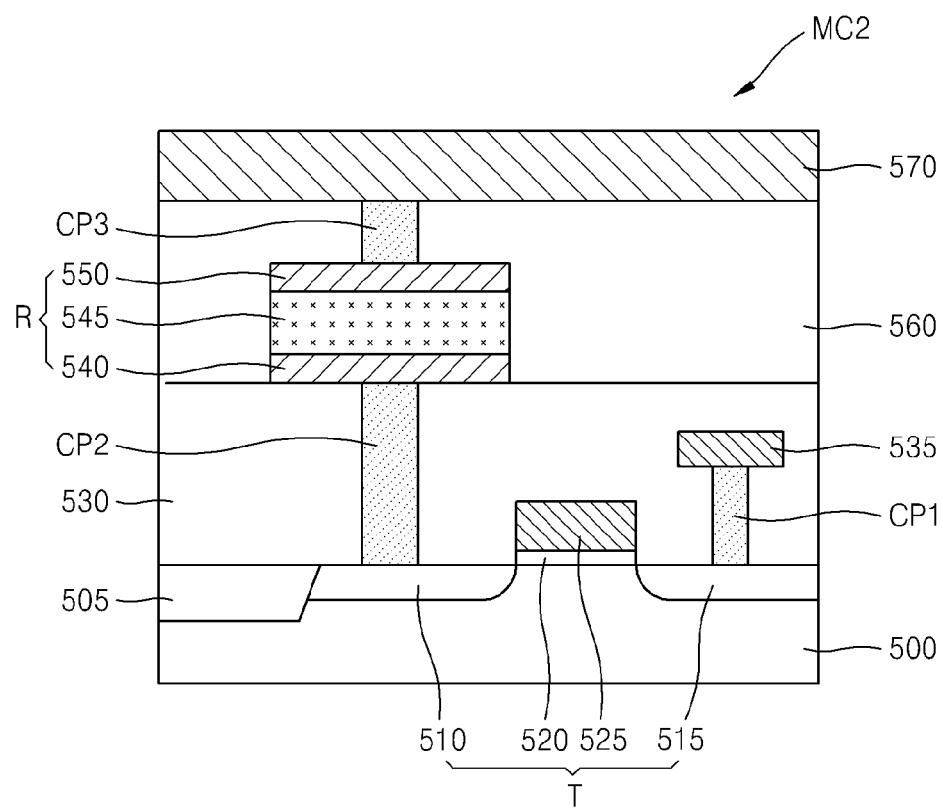
FIG. 24 is a cross-sectional view of the semiconductor device of FIG. 23, according to an embodiment of the present invention.

FIG. 24 is a cross-sectional view of the semiconductor device of FIG. 23, according to an embodiment of the present invention. Referring to FIG. 24, an isolation layer 505 is formed in a region of a semiconductor substrate 500 so as to define an active region. A drain region 510 and a source region 515 are formed in the active region to be disposed apart from each other. A gate insulating layer 520 is disposed on the active region between the drain region 510 and the source region 515, and a gate electrode 525 is disposed on the gate insulating layer 520. The gate electrode 525 may extend to act as a word line or may be connected to a word line (not shown). The gate electrode 525, the drain region 510, and the source region 515 form an access transistor T together.

A first interlevel insulating layer 530 is formed on the access transistor T, and a first contact plug CP1 and a second contact plug CP2 are formed in the first interlevel insulating layer 530. The source region 515 may be connected to a source line SL via the first contact plug CP1, and the drain region 510 may be connected to a lower electrode 540 via the second contact plug CP2.

A second interlevel insulating layer 560 is formed on the first interlevel insulating layer 530, and the lower electrode 540, a variable resistance material layer 545, and an upper electrode 550 are sequentially formed in a region of the second interlevel insulating layer 560. The upper electrode 550 may be connected to a bit line 570 via a third contact plug CP3. The lower electrode 540, the variable resistance material layer 545, and the upper electrode 550 form a variable resistance device R together. The variable resistance device R corresponds to the variable resistance device 10.

Cases where variable resistance devices according to embodiments of the present invention are included in a single-bit non-volatile memory device or a multi-bit non-volatile memory device, have been described above in detail. However, each of variable resistance devices according to embodiments of the present invention may be included into a logic gate so as to be used in a logic circuit. In this case, the size of the logic circuit may be reduced and the integration degree of a memory device may be improved. Particularly, a variable resistance device according to an embodiment of the present invention may be applied to a memristor. Thus, the memristor may operate substantially in a similar manner to one of the methods of operating a semiconductor device described above with reference to FIGS. 7 to 19. Here, the "memristor" refers to a device, in which, for example, the direction and amount of current are memorized and a resistance value varies according to the memorized direction and amount of current.

Figure 25:
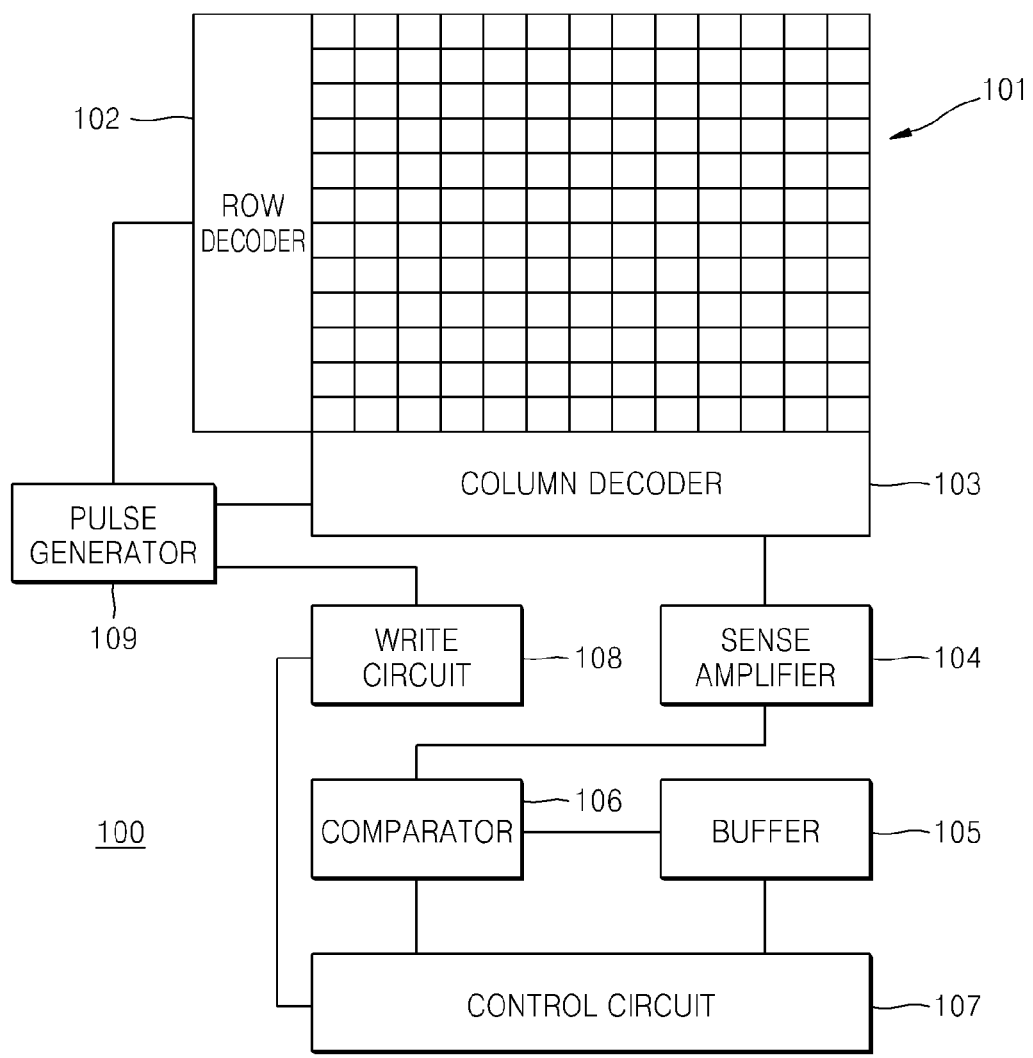
FIG. 25 is a schematic block diagram of a semiconductor device according to an embodiment of the present invention.

FIG. 25 is a block diagram of a semiconductor device, e.g., a non-volatile memory device 100, which includes a variable resistance device, according to an embodiment of the present invention. Referring to FIG. 25, the non-volatile memory device 100 may include a memory cell array 101, a row decoder 102, a column decoder 103, a sense amplifier 104, a buffer 105, a comparator 106, a write circuit 108, and a control circuit 107. The memory cell array 101 includes a plurality of unit cells, such as the unit cell MC1 of FIG. 22 or the unit cell MC2 of FIG. 23, which are arranged in a matrix. The row decoder 102 sequentially activates the plurality of unit cells included in the memory cell array 101 in units of rows. The column decoder 103 sequentially activates the plurality of unit cells included in the memory cell array 101 in units of columns. The sense amplifier 104 amplifies a current value output from the column decoder 103. The buffer 105 stores a reference current value. The comparator 106 compares a current value amplified by the sense amplifier 104 with the reference current value stored in the buffer 105. The write circuit 108 applies a set/reset voltage to unit cells being respectively activated by the row decoder 102 and the column decoder 103. The control circuit 107 controls operations of the buffer 105, the comparator 106, and the write circuit 108.

For example, after the write circuit 108 applies a reset voltage to a variable resistance device included in a unit cell from among the plurality of unit cells (operation 120 of FIG. 7), the row decoder 102 activates one of rows of the memory cell array 101 and the column decoder 103 activates one of columns of the memory cell array 101 in order to sense a reset current (operation 130 of FIG. 7). Thus, a current value (reset current) of the unit cell, which is disposed at the intersection of the activated row and column, in an 'OFF' state may be sensed. The current value sensed by the column decoder 103 may be amplified by the sense amplifier 104 and be then provided to the comparator 106.

Then, the comparator 106 may compare the sensed current value with the reference current value to determine whether the reset current falls within a first range of current (operation 140 of FIG. 7). The reference current value is a predetermined current value to improve the dispersion of 'OFF' current and may be stored in the buffer 105. A passive device or a reference device (not shown), such as a transistor, may be used to store the reference current value.

The comparator 106 may compare the sensed current value (reset current) with the first range of current and provide the control circuit 107 with a result of the comparison. For example, if the sensed current value (reset current) falls within the first range of current, the comparator 106 may transmit an output signal in a first state to the control circuit 107. However, if the sensed current value (reset current) does not fall within the first range of current, the comparator 106 may transmit an output signal in a second state to the control circuit 107.

The control circuit 107 operates to perform any of methods of operating a semiconductor device according to various embodiments of the present invention, as described above. For example, if the control circuit 107 receives the output signal in the first state from the comparator 106, then it is determined that a reset operation is normally performed and the method of FIG. 7 ends. However, if the control circuit 107 receives the output signal in the second state from the comparator 106, then the control circuit 107 may control, for example, the write circuit 108, the sense amplifier 104, the buffer 105, and the comparator 106 to additionally perform operations 120 to 140 of FIG. 7. Thus, it is possible to secure a sufficient sensing margin between an 'ON' state and an 'OFF' state of, for example, the variable resistance device 10 of FIG. 1 (or the variable resistance device 10' of FIG. 2).

The control circuit 107 may store the reference current value in the buffer 105. In order to secure a high sensing margin in the semiconductor device, the control circuit 107 may set the reference current value to reduce the first range of current and store the reference current value in the buffer 105. However, in order to secure a relatively low sensing margin in the semiconductor device, the control circuit 107 may set the reference current value to increase the first range of current and store the reference current value in the buffer 105.

Figure 26:
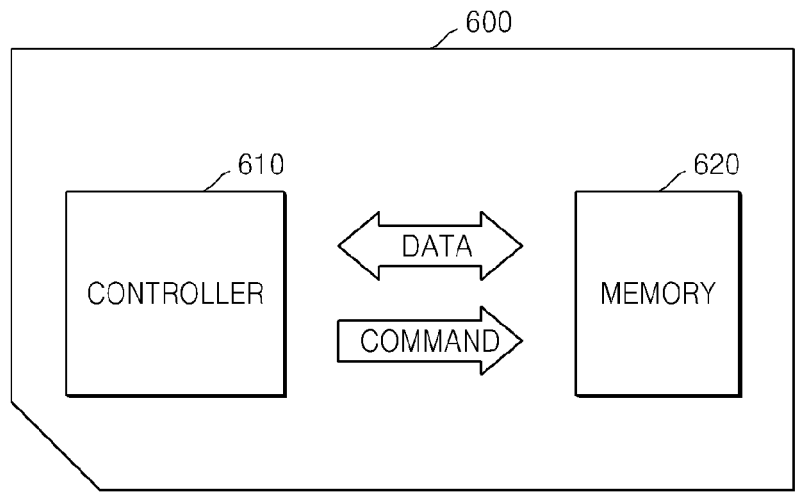
FIG. 26 is a schematic block diagram of a memory card according to an embodiment of the present invention.

FIG. 26 is a schematic block diagram of a memory card 600 according to an embodiment of the present invention. Referring to FIG. 26, the memory card 600 includes a controller 610 and a memory unit 620. The controller 610 and the memory unit 620 may be disposed to exchange an electrical signal with each other. For example, if the controller 170 provides a command to the memory unit 610, then the memory unit 620 may transmit data to the controller 1710. The memory unit 620 may include a non-volatile memory device that includes a variable resistance device according to one of the embodiments describe above.

The memory card 600 may be embodied in various types of cards (memory devices), e.g., a memory stick card, a smart media (SM) card, a secure digital (SD) card, a mini SD card, and a multi-media card (MMC).

Figure 27:
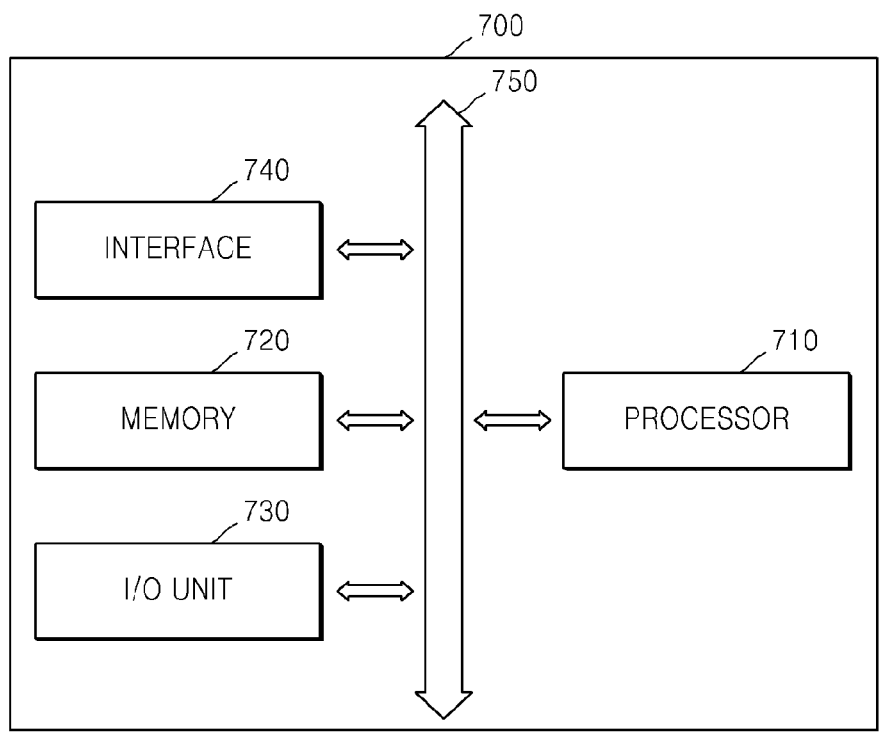
FIG. 27 is a schematic block diagram of an electronic system according to an embodiment of the present invention.

FIG. 27 is a schematic block diagram of an electronic system 700 according to an embodiment of the present invention. Referring to FIG. 27, the electronic system 700 may include a processor 710, a memory unit 720, an input/output (I/O) device 730, and an interface unit 740. The electronic system 700 may be a mobile system or a system capable of transmitting and receiving information. The mobile system may be a personal digital assistant (PDA), a portable computer, a web tablet, a wireless phone, a mobile phone, a digital music player, or a memory card.

The processor 710 may execute a program and control the electronic system 700. The processor 710 may be, for example, a microprocessor, a digital signal processor, a microcontroller, or the like.

The I/O device 730 may be used to input data to or output data from the electronic system 700. The electronic system 700 may be connected to an external device (not shown), such as a personal computer (PC) or a network, via the I/O device 730 so as to exchange data with the external device. The I/O device 730 may be, for example, a keypad, a keyboard, or a display.

The memory unit 720 may store code and/or data for operating the processor 710, and/or may store data processed by the processor 710. The memory unit 720 may include a non-volatile memory device that includes a variable resistance device according to one of the embodiments described above.

The interface unit 740 may be used as a path, in which the electronic system 700 exchanges data with an external device (not shown). The processor 710, the memory unit 730, the I/O device 730, and the interface unit 740 may communicate with one another via a bus 750.

For example, the electronic system 700 may be employed in a mobile phone, an MP3 player, a navigation device, a portable multimedia player (PMP), a solid state drive (SSD), or household appliances.

As described above, according to one or more of the above embodiments of the present invention, if a reset voltage is applied to a variable resistance device included in a semiconductor device so as to write data corresponding to an 'off' state to the semiconductor device, then the reset voltage may be repeatedly applied to the variable resistance device until the amount of reset current flowing through the variable resistance device to which the reset voltage is applied falls within a predetermined range of current. Accordingly, it is possible to greatly improve the dispersion of 'off' current of the semiconductor device, thereby improving the reliability of the semiconductor device.

According to one or more of the above embodiments of the present invention, a reset voltage is applied to a variable resistance device included in a semiconductor device, reset current flowing through the variable resistance device to which the reset voltage is applied is sensed, and it is determined whether the sensed reset current falls within a predetermined range of current, thereby improving the durability of the semiconductor device. Also, a driving circuit for driving the semiconductor device is manufactured in a simple construction, thereby improving the operating speed of the semiconductor device and reducing power consumption thereof.

It should be understood that the exemplary embodiments described therein should be considered in a descriptive sense only and not for purposes of limitation. It should be understood that the exemplary embodiments described therein should be considered in a descriptive sense only and not for purposes of limitation. Descriptions of features or aspects within each embodiment should typically be considered as available for other similar features or aspects in other embodiments. Descriptions of features or aspects within each embodiment should typically be considered as available for other similar features or aspects in other embodiments.

What is claimed is:

1. A method of operating a semiconductor device that includes a variable resistance device, the method comprising:
    applying a first voltage to the variable resistance device so as to change a resistance value of the variable resistance device from a first resistance value to a second resistance value that is different from the first resistance value;
    sensing first current flowing through the variable resistance device to which the first voltage is applied;
    determining whether the first current falls within a first range of current; and
    if the first current does not fall within the first range of current, applying an additional first voltage that is equal to the first voltage to the variable resistance device.

2. The method of claim 1, wherein the first resistance value is a set resistance value, the second resistance value is a reset resistance value, and the second resistance value is greater than the first resistance value.

3. The method of claim 1, wherein the sensing of the first current comprises sensing the first current flowing through the variable resistance device by applying a read voltage, the magnitude of which is lower than the first voltage.

4. The method of claim 1, wherein, during the applying of the first voltage, the first voltage is applied for about 1 μs to about 1 ns.

5. The method of claim 1, wherein the additional first voltage has the same pulse width as the first voltage.

6. The method of claim 2, wherein the first range of current is preset in such a manner that a sensing margin is secured between on current flowing through the variable resistance device when the variable resistance device has the first resistance value and 'off' current flowing through the variable resistance device when the variable resistance device has the second resistance value.

7. The method of claim 2, wherein the first range of current is preset in such a manner that a sensing margin is secured between first 'off' current flowing through the variable resistance device when the variable resistance device has the second resistance value and second 'off' current flowing through the variable resistance device when the variable resistance device has a third resistance value that is greater than the second resistance value.

8. The method of claim 1, further comprising repeatedly performing the sensing of the first current and the determining of whether the first current falls within the first range of current with respect to the variable resistance device to which the additional first voltage is applied.

9. The method of claim 8, wherein, until the first current falls within the first range of current, the applying of the additional first voltage to the variable resistance device, the sensing of the first current, and the determining of whether the first current falls within the first range of current are repeatedly performed.

10. The method of claim 1, before the determining of whether the first current falls within the first range of current, further comprising determining whether the first current falls within a second range of current that is a range of current of data corresponding to the second resistance value.

11. The method of claim 10, wherein the first range of current is included in the second range of current.

12. The method of claim 10, if the first current is greater than a maximum value in the second range of current, further comprising changing the first voltage.

13. The method of claim 12, wherein the applying of the changed first voltage and the sensing of the first current are repeatedly performed on the variable resistance device.

14. The method of claim 10, if the first current is less than a minimum value in the second range of current, further comprising applying a second voltage to the variable resistance device so that the resistance value of the variable resistance device is changed from the second resistance value to the first resistance value.

15. The method of claim 14, wherein the applying of the first voltage and the sensing of the first current are repeatedly performed on the variable resistance device to which the second voltage is applied.

16. The method of claim 1, wherein the determining of whether the first current falls within the first range of current comprises at least one of:
    determining whether the first current is less than a maximum value in the first range of current; and
    determining whether the first current is greater than a minimum value in the first range of current.

17. The method of claim 1, wherein the determining of whether the first current falls within the first range of current comprises determining the difference between 'on' current flowing through the variable resistance device when the variable resistance device has the first resistance value and the first current is greater than a desired level.

18. The method of claim 1, further comprising:
applying a second voltage to the variable resistance device so that the resistance value of the variable resistance device is changed from the second resistance value to the first resistance value; and
sensing second current flowing through the variable resistance device to which the second voltage is applied.

19. The method of claim 18, wherein the sensing of the second current comprises sensing the second current flowing through the variable resistance device to which the second voltage is applied, by applying a read voltage, the magnitude of which is lower than the first voltage and the second voltage.

20. The method of claim 18, wherein the second voltage is applied for about 1 μs to about 1 ns.

21. The method of claim 18, wherein the applying of the first voltage to the variable resistance device is performed after performing the sensing of the second current.

22. The method of claim 18, further comprising;
determining whether the second current falls within a third range of current; and
if the second current does not fall within the third range of current, applying an additional second voltage that is equal to the second voltage to the variable resistance device.

23. The method of claim 22, if the second current falls within the third range of current, further comprising applying the first voltage to the variable resistance device.

24. The method of claim 22, wherein the sensing of the second current and the determining of whether the second current falls within the third range of current are repeatedly performed with respect to the variable resistance device to which the additional second voltage is applied.

25. A variable resistance device comprising:
a first electrode and a second electrode;
a variable resistance material layer disposed between the first and second electrodes, a resistance value of the variable resistance material layer being changed from a first resistance value to a second resistance value greater than the first resistance value when a first voltage is applied between the first and second electrodes, and being changed from the second resistance value to the first resistance value when a second voltage is applied between the first and second electrodes,
wherein, if the variable resistance material layer has the second resistance value, the first voltage is repeatedly applied to the variable resistance material layer until current flowing through the variable resistance device falls within a first range of current.

26. The variable resistance device of claim 25, wherein the resistance value of the variable resistance material layer is changed from the second resistance value to a third resistance value that is greater than the second resistance value, when a third voltage that is greater than the first voltage is applied to the variable resistance material layer, and
if the variable resistance material layer has the third resistance value, the third voltage is repeatedly applied to the variable resistance device until current flowing through the variable resistance material layer falls with a second range of current.

27. A semiconductor device comprising:
a variable resistance device, the resistance value of which is changed from a first resistance value to a second resistance value that is greater than the first resistance value when a first voltage is applied to the variable resistance device, and is changed from the second resistance value to the first resistance value when a second voltage is applied to the variable resistance device; and
a selection device connected in series to the variable resistance device, wherein, if the variable resistance device has the second resistance value, the first voltage is repeatedly applied to the variable resistance device until current flowing through the variable resistance device falls within a first range of current.

28. The semiconductor device of claim 27, wherein the resistance value of the variable resistance device is changed from the second resistance value to a third resistance value that is greater than the second resistance value when a third voltage that is higher than the first voltage is applied to the variable resistance device, and
if the variable resistance device has the third resistance value, the third voltage is repeatedly applied to the variable resistance device until current flowing through the variable resistance device falls within a second range of current.

* * * * *